(12) United States Patent
Oyama et al.

(10) Patent No.: US 10,096,504 B2
(45) Date of Patent: Oct. 9, 2018

(54) METHOD FOR MANAGING ATMOSPHERE IN STORAGE CONTAINER

(71) Applicant: Tokyo Electron Limited, Tokyo (JP)

(72) Inventors: Katsuhiko Oyama, Iwate (JP); Yasushi Takeuchi, Iwate (JP); Shinji Asari, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 680 days.

(21) Appl. No.: 14/247,371

(22) Filed: Apr. 8, 2014

(65) Prior Publication Data

US 2014/0305540 A1 Oct. 16, 2014

(30) Foreign Application Priority Data

Apr. 12, 2013 (JP) ................. 2013-083652

(51) Int. Cl.
*H01L 21/677* (2006.01)
*H01L 21/673* (2006.01)

(52) U.S. Cl.
CPC .. *H01L 21/67389* (2013.01); *H01L 21/67379* (2013.01); *H01L 21/67769* (2013.01); *H01L 21/67772* (2013.01)

(58) Field of Classification Search
CPC ......... H01L 21/67389; H01L 21/67772; H01L 21/67379; H01L 21/67769
See application file for complete search history.

(56) References Cited

U.S. PATENT DOCUMENTS

| 6,875,282 B2 | 4/2005 | Tanaka et al. | |
| 2001/0055522 A1* | 12/2001 | Kaneda | H01L 21/67772 |
| | | | 414/217 |
| 2009/0129897 A1* | 5/2009 | Babbs | H01L 21/67201 |
| | | | 414/217 |
| 2014/0112739 A1* | 4/2014 | Hirano | H01L 21/67017 |
| | | | 414/217.1 |
| 2015/0340259 A1* | 11/2015 | Wakabayashi | H01L 21/67772 |
| | | | 414/222.01 |

FOREIGN PATENT DOCUMENTS

| JP | 10-144766 A | 5/1998 | |
| JP | 2004-022674 A | 1/2004 | |
| JP | 2005-079250 A | 3/2005 | |
| JP | 2006-086308 A | 3/2006 | |
| JP | 4308975 B | 5/2009 | |
| JP | 2012-054392 A | 3/2012 | |
| JP | 2012-233690 | * 10/2012 | ............. C23C 16/44 |

* cited by examiner

*Primary Examiner* — Saul Rodriguez
*Assistant Examiner* — Ashley K Romano
(74) *Attorney, Agent, or Firm* — Abelman, Frayne & Schwab

(57) ABSTRACT

A method for managing an atmosphere in a storage container in a processing apparatus including a substrate transfer region and a container transfer region which are partitioned by a partition wall; a load port; a container keeping rack; and a cover opening/closing mechanism, includes substituting the internal atmosphere of the storage container that stores non-processed substrates with the inert gas for using the cover opening/closing mechanism; transferring the storage container of which the internal atmosphere has been substituted with the inert gas, to the container keeping rack and placing and keeping the storage container on the container keeping rack; and putting the storage container on standby on the container keeping rack while maintaining the atmosphere substituted with the inert gas.

20 Claims, 16 Drawing Sheets

(A)

(B)

(C)

(D)

(E)

(F)

(G)

(H)

(I)

METHOD FOR MANAGING ATMOSPHERE IN STORAGE CONTAINER

CROSS-REFERENCE TO RELATED APPLICATIONS

This application is based on and claims priority from Japanese Patent Application No. 2013-083652, filed on Apr. 12, 2013 with the Japan Patent Office, the disclosures of which is incorporated herein in its entirety by reference.

TECHNICAL FIELD

The present disclosure relates to a method for managing an atmosphere in a storage container.

BACKGROUND

Conventionally, in a semiconductor manufacturing process, it is required to perform several different kinds of processings such as, for example, a heat treatment, a film forming processing and an etching processing, repeatedly on a semiconductor wafer (hereinafter, simply referred to as a "wafer"). Since such various processes are often performed in different processing apparatuses, it is required to transfer the wafer among processing apparatuses. Accordingly, in order to prevent adhesion of foreign substances or formation of a natural oxide film on the surface of the wafer when the wafer is transferred, the wafer is stored in a substrate storage container (wafer carrier) which is called a front-opening unified pod (FOUP), and is transferred in a state where the degree of cleanliness in the container is maintained at a certain level. The FOUP includes a container in which a plurality of semiconductor wafers may be placed horizontally, and a cover provided on the front side of the container. The cover is provided with a locking mechanism such that the semiconductor is hermetically stored.

Meanwhile, each processing apparatus that performs a processing on wafers is formed with a transfer port so as to carry the wafers stored in the FOUP into the processing apparatus. The transfer port is opened/closed by an opening/closing door pursuant to the front-opening interface mechanical standard (FIMS). The opening/closing door is provided with a cover opening/closing mechanism configured to remove a cover provided on the front side of the FOUP. That is, the opening/closing door is required to play a role to open/close the cover so as to deliver the wafers between the FOUP and a wafer transfer region in the processing apparatus, as well as a role to isolate the wafer transfer region from a carrier transfer region so as to maintain the wafer transfer region at a low oxygen concentration.

A process of removing the cover will be described in detail. The cover opening/closing mechanism moves forward to the cover of the FOUP in a state where the front surface of the FOUP comes in close contact with the transfer port of the processing apparatus, and acts on the locking mechanism provided on the cover to release the locking. Then, the cover opening/closing mechanism is moved backward to the wafer transfer region side in the processing apparatus while holding the cover in which the locking is released such that the wafers in a carrier are opened to the wafer transfer region. When the FOUP is opened, nitrogen gas is purged into a space between the opening/closing door and the FOUP such that an internal atmosphere of the FOUP is substituted with the nitrogen gas. As such, the wafers carried out of the FOUP are not exposed to oxygen, and carried into the apparatus in a state where no oxygen gets in the processing apparatus.

However, when the FOUP is carried into various processing apparatus, in some cases, the FOUP may be installed just in the transfer port and carried into the wafer transfer region of the processing apparatus, or the FOUP may be first kept on the container keeping rack which is called a stocker where the FOUP is placed. Generally, in a processing apparatus that performs a batch processing, in order to process wafers stored in a plurality of FOUPs at once, the plurality of FOUPs are first stored in the stocker and installed successively alternatively in the transfer port to carry the wafers into the wafer transfer region by the number of sheets to be processed at one time. Accordingly, when the stocker is on standby, the wafers may be hermetically stored in the FOUPs so as to maintain the degree of cleanliness at a certain level. Further, when the FOUPs are transferred to the wafer transfer region, the FOUPs may be carried immediately into the processing container to be subjected to the processing. Accordingly, it is possible to perform the processing while maintaining the wafers in a clean state.

Further, as for a substrate processing apparatus using such a stocker, there is known a substrate processing apparatus having a configuration in which after a nitrogen gas inlet port provided in the bottom plate of an FOUP cassette is fitted in a nitrogen gas supply port on a rack plate, nitrogen gas flows into the FOUP cassette from the nitrogen gas supply port such that the FOUP cassette is filled with the nitrogen gas such that a nitrogen substitution is performed in the FOUP even when the FOUP cassette is on standby on the rack plate of the cassette rack (stocker). See, e.g., Japanese Patent No. 4308975.

By such a configuration, the degree of cleanliness in the FOUP may be maintained by performing the nitrogen substitution in the FOUP even when the FOUP is on standby on the stocker.

SUMMARY

According to an aspect of the present disclosure, a method for managing an atmosphere in a storage container in a processing apparatus including a substrate transfer region and a container transfer region which are partitioned by a partition wall having a transfer port that is opened/closed by an opening/closing door; a load port provided in the container transfer region and configured to place the storage container therein; a container keeping rack provided in the container transfer region and configured to temporarily place a storage container configured to hermetically store a plurality of substrates by opening/closing a cover such that the storage container is put on standby; and a cover opening/closing mechanism provided in the opening/closing door, and configured to substitute an internal atmosphere of the storage container with an inert gas while removing the cover of the storage container which is in close contact with an inlet edge of the transfer port, includes: substituting the internal atmosphere of the storage container that stores non-processed substrates with the inert gas for using the cover opening/closing mechanism; transferring the storage container of which the internal atmosphere has been substituted with the inert gas, to the container keeping rack and placing and keeping the storage container on the container keeping rack; and putting the storage container on standby on the container keeping rack while maintaining the atmosphere substituted with the inert gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 14A is a view illustrating a state where the carrier is introduced into a load port. FIG. 14B is a view illustrating a state where a nitrogen substitution process is performed. FIG. 14C is a view illustrating a state where the carrier is transferred from the load port to a carrier keeping rack. FIG. 14D is a view illustrating an example of a carrier keeping process and an atmosphere maintenance process. FIG. 14E is a view illustrating a state where the carrier keeping rack is filled. FIG. 14F is a view illustrating an example of a carrier movement process. FIG. 14G is a view illustrating an example of a process step. FIG. 14H is a view illustrating an example of a wafer carry-out process. FIG. 14I is a view illustrating an example of a carrier carry-out process.

FIG. 17A is a view illustrating a configuration of the carrier keeping rack of the vertical heat treatment apparatus according to the present exemplary embodiment. FIG. 17B is a view illustrating a surface of an example of the carrier keeping rack in an enlarged scale. FIG. 17C is a view illustrating a supply nozzle of the carrier keeping rack. FIG. 17D is a view illustrating an exhaust nozzle of the carrier keeping rack.

DETAILED DESCRIPTION

Figure 1:
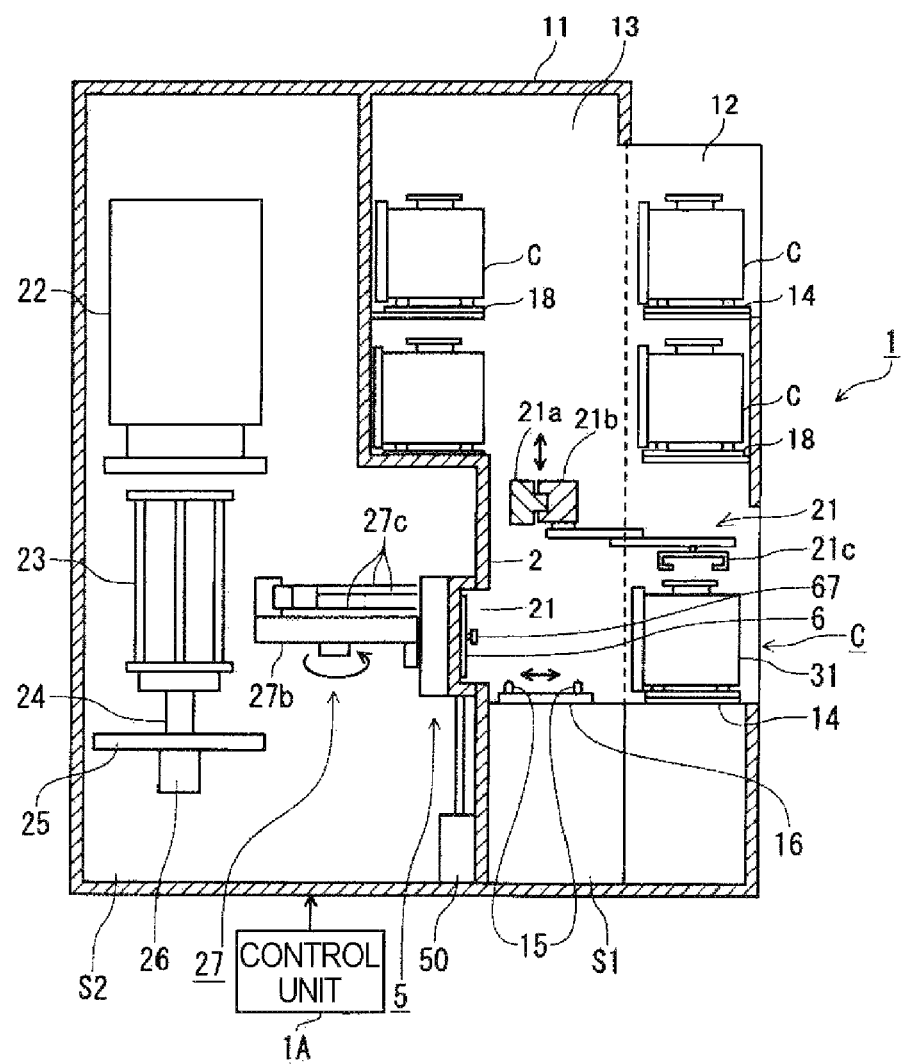
FIG. 1 is a vertical cross-sectional view illustrating an example of a vertical heat treatment apparatus suitable to perform a method for managing an atmosphere in a storage container according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Recently, in a semiconductor manufacturing process, it has been requested that humidity for wafers in a FOUP be managed appropriately before and after a processing as well as during the processing in the processing apparatus. Further, a degree of cleanliness in the apparatus needs to be maintained as usual from the viewpoint of saving energies, but the degree of cleanliness tends to be reduced in a region between apparatuses in a clean room. Accordingly, it has been requested that an atmosphere in a FOUP, which accommodates wafers waiting in the processing apparatus, be maintained appropriately at the apparatus side, for example, by nitrogen substitution. In addition, from the viewpoint of enhancing the throughput, it has been requested that the humidity adjustment in the FOUP, for example, by nitrogen substitution be performed at a high speed.

However, in the above-mentioned configuration described in Japanese Patent No. 4308975, the diameter of the nitrogen gas inlet port provided in the bottom plate of the FOUP cassette is too small to supply nitrogen into the FOUP cassette at a high flow rate. Accordingly, there is a problem in that the nitrogen substitution cannot be performed at a high speed.

Further, since the diameter of the nitrogen gas inlet port cannot be too large from the viewpoint of maintaining a sealing property of the FOUP cassette, its structural change is also difficult.

Accordingly, an object of the present disclosure is to provide a method for managing an atmosphere in a storage container, in which an internal atmosphere of a wafer storage container such as an FOUP may be substituted with an inert gas at a high speed.

In order to achieve the above-mentioned object, the present disclosure provides a method for managing an atmosphere in a storage container in a processing apparatus including a substrate transfer region and a container transfer region which are partitioned by a partition wall having a transfer port that is opened/closed by an opening/closing door; a load port provided in the container transfer region and configured to place the storage container therein; a container keeping rack provided in the container transfer region and configured to temporarily place a storage container configured to hermetically store a plurality of substrates by opening/closing a cover such that the storage container is put on standby; and a cover opening/closing mechanism provided in the opening/closing door, and configured to substitute an internal atmosphere of the storage container with an inert gas while removing the cover of the storage container which is in close contact with an inlet edge of the transfer port. The method includes: substituting the internal atmosphere of the storage container that stores non-processed substrates with the inert gas for using the cover opening/closing mechanism; transferring the storage container of which the internal atmosphere has been substituted with the inert gas, to the container keeping rack and placing and keeping the storage container on the container keeping rack; and putting the storage container on standby on the container keeping rack while maintaining the atmosphere substituted with the inert gas.

In the above-mentioned method, when the storage container is placed on the load port and the gas substitution process is not performed by the cover opening/closing mechanism, the storage container is transferred to a position at which the cover is removable by the cover opening/closing mechanism.

In the above-mentioned method, when the storage container is placed in the load port and while the internal gas of another storage is being substituted with the inert gas by the cover opening/closing mechanism, the storage container is placed temporarily on the container keeping rack, and after the internal gas of the another has been substituted with the inert gas, the storage container is transferred to the position at which the cover is removable by the cover opening/closing mechanism.

In the above-mentioned method, the cover opening/closing mechanism substitutions the internal atmosphere with the inert gas by injecting the inert gas into the storage container at a first flow rate, and the container keeping rack supplies the inert gas into the storage container at a second flow rate which is smaller than the first flow rate.

The above-mentioned method further includes temporarily substituting the internal atmosphere of the storage container with the inert gas when the storage container is placed in the load port.

In the above-mentioned method, the internal atmosphere is temporarily substituted with the inert gas at the second flow rate.

In the above-mentioned method, the first flow rate is at least three times higher than the second flow rate.

In the above-mentioned method, the time required for the cover substitution mechanism to substitute the internal atmosphere of the storage container with the inert gas is a fifth or less of the time required for the container keeping rack to substitute the internal atmosphere of the storage container with the inert gas.

In the above-mentioned method, the container keeping rack supplies the inert gas from an opening formed in the bottom of the storage container.

In the above-mentioned method, the load port supplies the inert gas from an opening formed in the bottom of the storage container.

In the above-mentioned method, the inert gas is nitrogen gas.

In the above-mentioned method, the atmosphere in the storage container is managed based on humidity.

The above-mentioned method further includes: moving the storage container, which is on standby on the container keeping rack, to the position at which the cover is removable by the cover opening/closing mechanism; and substituting the internal atmosphere of the storage container with the inert gas while removing the cover by the cover opening/closing mechanism, and carrying the substrates into the substrate transfer region in the storage container.

In the above-mentioned method, the processing apparatus is a batch type processing apparatus provided with a processing container configured to process a plurality of substrates in the storage container at once.

In the above-mentioned method, a plurality of cover opening/closing mechanisms is provided, and the plurality of cover opening/closing mechanisms substitutes the internal atmosphere of the storage container with the inert gas in parallel.

In the above-mentioned method, a plurality of the cover opening/closing mechanisms is provided, and the moving of the storage container and the carrying of the substrates are performed by the plurality of the cover opening/closing mechanisms in parallel.

The above-mentioned method further includes: storing the plurality of substrates, which have been processed by the by the processing container, in the storage container using the cover opening/closing mechanism while substituting the internal atmosphere of the storage container with the inert gas; and temporarily placing the storage container, which stores the plurality of substrates processed by the processing container, on the container keeping rack.

The above-mentioned method further includes, after the temporarily placing of the container, carrying the storage container out of the processing apparatus.

In the above-mentioned method, the processing apparatus is a heat treatment apparatus provided with a heat treatment furnace in the substrate transfer region.

According to the present disclosure, it is possible to substitute an inert gas for the inside of the storage container at a high speed.

Hereinafter, exemplary embodiments of the present disclosure will be described with reference to the accompanying drawings.

Figure 2:
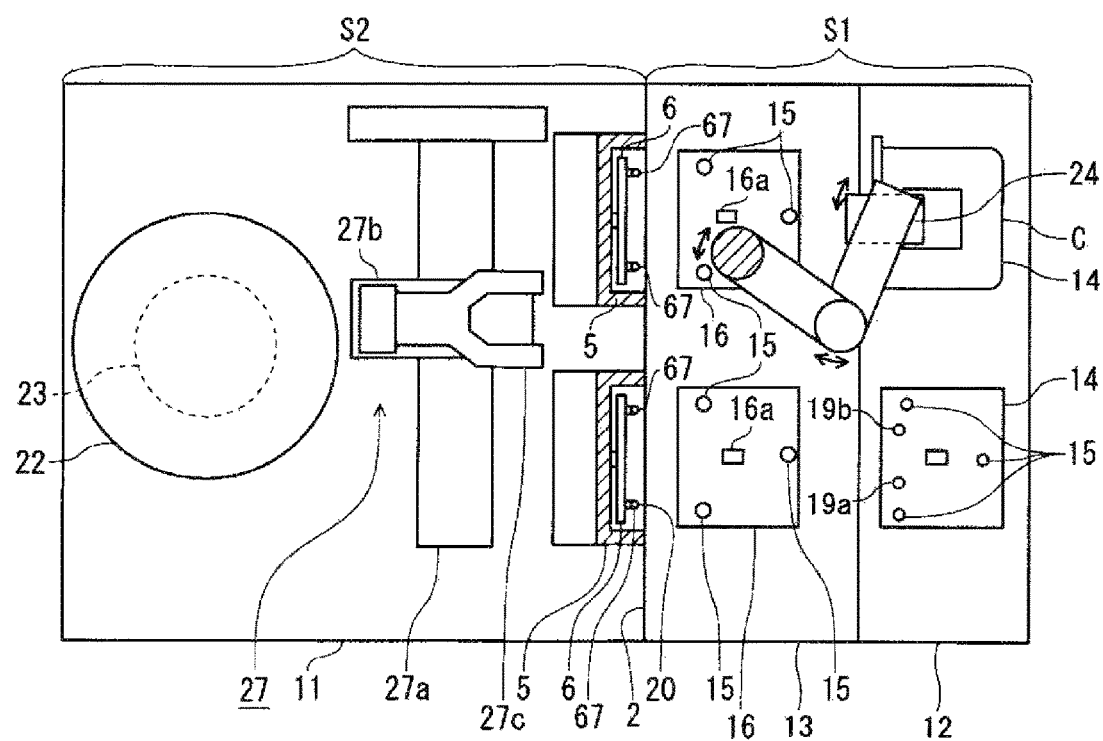
FIG. 2 is a plan view illustrating the vertical heat treatment apparatus of FIG. 1 partially in horizontal cross-section.

FIG. 1 is a vertical cross-sectional view illustrating an example of a vertical heat treatment apparatus suitable to perform a method for managing an atmosphere in a storage container according to an exemplary embodiment of the present disclosure. FIG. 2 is a plan view illustrating an example of the vertical heat treatment apparatus of FIG. 1 partially in horizontal cross-section.

Further, the method for managing an atmosphere in a storage container according to an exemplary embodiment of the present disclosure may be applied to various processing apparatuses other than the vertical heat treatment apparatus. However, in order to facilitate the understanding, in the present exemplary embodiment, the method for managing an atmosphere in a storage container will be described with reference to an example performed using a vertical heat treatment apparatus, which is one of specific processing apparatuses.

As illustrated in FIGS. 1 and 2, a vertical heat treatment apparatus 1 is configured to be accommodated in a case 11. The case 11 constitutes an outer casing of the vertical heat treatment apparatus 1. The case 11 is formed with a carrier transfer region S1 in which a carrier C, which is a container storing wafers W to be processed, is carried into or carried out from the apparatus, and a wafer transfer region S2, which is a transfer region for carrying the wafers W in the carrier C into a heat treatment furnace as described below. The carrier C is an FOUP as described above.

The carrier transfer region S1 and the wafer transfer region S2 are partitioned by a partition wall 2. The carrier transfer region S1 is a region under an air atmosphere in which the wafers W stored in the carrier C are transferred. A region between the respective processing apparatuses corresponds to the carrier transfer region S1. In the present exemplary embodiment, a space in a clean room outside the vertical heat treatment apparatus 1 corresponds to the carrier transfer region S1. Meanwhile, the wafer transfer region S2 is under an inert gas atmosphere, such as a nitrogen ($N_2$) atmosphere, has a higher degree of cleanliness than that of carrier transfer region S1, and is maintained at a low oxygen concentration in order to suppress formation of an oxide film on the wafers W carried therein. In the following description, the arrangement direction of the carrier transfer region S1 and the wafer transfer region S2 is deemed as a longitudinal direction of the heat treatment apparatus 1.

The partition wall 2 is provided with a transfer port 20 to transfer the wafers W between the carrier transfer region S1 and the wafer transfer region S2 through the transfer port 20. The transfer port 20 is provided with an opening/closing door configured to open/close the transfer port 20. A cover opening/closing mechanism 6 is provided at the carrier transfer region S1 side of the opening/closing door 5. The transfer port 20, the opening/closing door 5 and the cover opening/closing door 6 are constituted with the above-mentioned FIMS (or FIMS port).

The carrier transfer region S1 will be described. The carrier transfer region S1 includes a first transfer region 12 and a second transfer region 13 located at a rear side of the first transfer region 12 (wafer transfer region S2 side).

As illustrated in FIG. 1, the first transfer region 12 is provided with two tiers of upper and lower load ports 14 and a carrier keeping rack 18. The load ports 14 are carry-in placing tables configured to receive carriers C when the carriers C are carried into the vertical heat treatment apparatus 1. Each load port 14 is provided in a portion where the wall of the case 11 is opened, and configured to allow access to the vertical heat treatment apparatus 1 from the outside. Specifically, the carriers C may be carried in and disposed on the load ports 14 and carried out from the load ports 14 to the outside by a carrier transfer apparatus (not illustrated) provided outside the vertical heat treatment apparatus 1. Further, since two load ports 14 are present at upper and lower tiers, carriers C may be carried into or out of both the load ports.

Further, the carrier keeping rack 18 is provided between the two tiers of upper and lower load ports 14 in the first transfer region 12. Although such a carrier keeping rack 18 is also provided in the second transfer region 13, carrier keeping racks 18 may be provided even at a position where the load ports 14 in the first transfer region 13 are not provided in order to keep many carriers C in the vertical heat treatment apparatus 1. Further, the configuration and functions of the carrier keeping rack 18 will be described below in detail.

As illustrated in FIG. 2, two load ports 14 where the carriers C are placed may be provided to be arranged in a widthwise direction of the first transfer region 12. Although the load ports 14 at the lower tier side of FIG. 1 are illustrated in FIG. 2, a plurality of load ports 14 at the upper tier side may also be provided to be arranged in the widthwise direction. Further, on the placing surface of each of the load ports 14, pins 15 configured to position the carrier C placed on the placing surface are provided, for example, in three places.

Each load port 14 may be provided with a supply nozzle 19a and an exhaust nozzle 19b. Each carrier C is generally provided with an intake port and an exhaust port on its bottom surface. The load port 14 may be provided with the supply nozzle 19a at a position where the supply nozzle 19a is fitted with the intake port of a carrier C when the carrier C is placed on the load port 14 and the exhaust nozzle 19b at a position where the exhaust nozzle is fitted with the exhaust port of the carrier C when the carrier C is placed on the load port 14. By providing the supply nozzle 19a and the exhaust nozzle 19b, the nitrogen substitution within the carrier C may be performed by supplying $N_2$ gas into the carrier C when the carrier C is placed on the load port 14. Accordingly, although the carrier C filled with an $N_2$ gas is transferred without supplying $N_2$ gas, the supply of the $N_2$ gas may be performed again immediately at the tier where the carrier C is carried into the load port 14 in the vertical heat treatment apparatus 1, thereby consistently maintaining the inside of the carrier in a clean state.

Further, the nitrogen substitution of the carrier C on the load port 14 may also be performed when the carrier C which stores the processed wafers W is carried out from the vertical heat treatment apparatus 1. Accordingly, the nitrogen substitution inside the carrier C placed on the load port 14 may also be performed when the carrier C is carried out.

Further, the flow rate of the $N_2$ gas supplied to the carrier C during the nitrogen substitution on the load port 14 may be at least 1 l/min, for example, 10 l/min to 20 l/min, preferably 13 l/min to 17 l/min, and more preferably 15 l/min.

In the second transfer region 13, two carrier placing tables 16 are disposed in the widthwise direction to be arranged before and after the load ports 14. Each of the carrier placing tables 16 is configured to be movable forward and rearward. Similarly to the load ports 14, on the placing surface of each of the carrier placing tables 16, pins 15 configured to position a carrier C are provided in three places. Further, on the placing surface of each of the carrier placing tables 16, a hook 16a configured to fix the carrier C is also provided.

As illustrated in FIG. 1, carrier keeping racks 18 configured to keep carriers C is provided at the upper side of the second transfer region 13. The carrier keeping racks 18 are constituted with two or more tiers of racks on each of which two carries may be placed left and right. FIG. 1 illustrates an example in which two tiers of racks are provided. Further, the carrier keeping racks 18 may be called a stocker.

Similarly to the load ports 14, the carrier keeping racks 18 may be each provided with a supply nozzle and an exhaust nozzle on its bottom surface so as to perform the nitrogen substitution within the carriers C placed on the carrier keeping rack 18. In the nitrogen substitution on the carrier keeping rack 18, the flow rate of the $N_2$ gas supplied to the carriers C may be the same as in the load ports 14, and may be at least 1 l/min, for example, 10 l/min to 20 l/min, preferably 13 l/min to 17 l/min, and more preferably 15 l/min. Further, the configuration including the supply nozzle and the exhaust nozzle of the carrier keeping rack 18 and the functions thereof will be described below in detail.

Accordingly, the nitrogen substitution at a low flow rate may be preferably performed in the load ports 14 and the carrier keeping rack 28 although it is not essential. Since carriers C such as FOUPs are not completely sealed, it is desirable to continuously perform the nitrogen substitution in order to maintain humidity even after a high-speed nitrogen substitution in a closed space with the cover opening/closing mechanism 6 as described below. Therefore, it is also desirable to continuously perform the nitrogen substitution in the load ports 14 and the carrier keeping rack 18. Further, in order to continuously maintain the humidity in the carriers C after the high-speed nitrogen substitution using the cover opening/closing mechanism 6, the flow rate of the $N_2$ gas should be at least 1 l/min, as described above.

The second transfer region 13 is provided with a carrier transfer mechanism 21 configured to transfer carriers C between the load ports 14, the carrier placing tables 16 and the carrier keeping rack 18. The carrier transfer mechanism 21 extends in the widthwise direction, and includes a guide unit 21a configured to move in the vertical direction, a moving unit 21b configured to move in the widthwise direction while being guided by the guide unit 21a, and a joint arm 21c provided in the moving unit 21b and configured to hold and transfer the carrier C horizontally.

The partition wall 2 is provided with the transfer port 20 for wafers W to make the carrier transfer region S1 and the wafer transfer region S2 communicate with each other. The transfer port 20 is provided with the opening/closing door 5 configured to close the transfer port 20 on the wafer transfer region S2 side. A driving mechanism 50 is connected to the opening/closing door 5, and the opening/closing door 5 is configured to be moved in the widthwise direction, and in the vertical direction by the driving mechanism so as to open/close the transfer port 20. The peripheral configurations of the opening/closing door 5 and the transfer port 20 will be described below in detail.

The wafer transfer region S2 is provided with a vertical heat treatment furnace 22 of which the lower end is opened as a furnace opening. Below the heat treatment furnace 22, a wafer boat 23 configured to maintain a plurality of wafers W in a rack form is placed on a cap 25 via an insulating unit 24. The cap 25 is supported on an elevation mechanism 26. The wafer boat 23 is carried into or out from the heat treatment furnace 22.

Further, a wafer transfer mechanism 27 is provided between the wafer boat 23 and the transfer port 20 in the partition wall 2. As illustrated in FIG. 2, the wafer transfer mechanism 27 moves along a guide mechanism 27a that extends in the widthwise, has a configuration in which five arms 27c configured to be movable forward and backward are provided on a moving body 27b that pivots around a vertical axis. The wafer transfer mechanism 27 transfers a wafer W between the wafer boat 23 and a carrier C on the carrier placing table 16.

Figure 3:
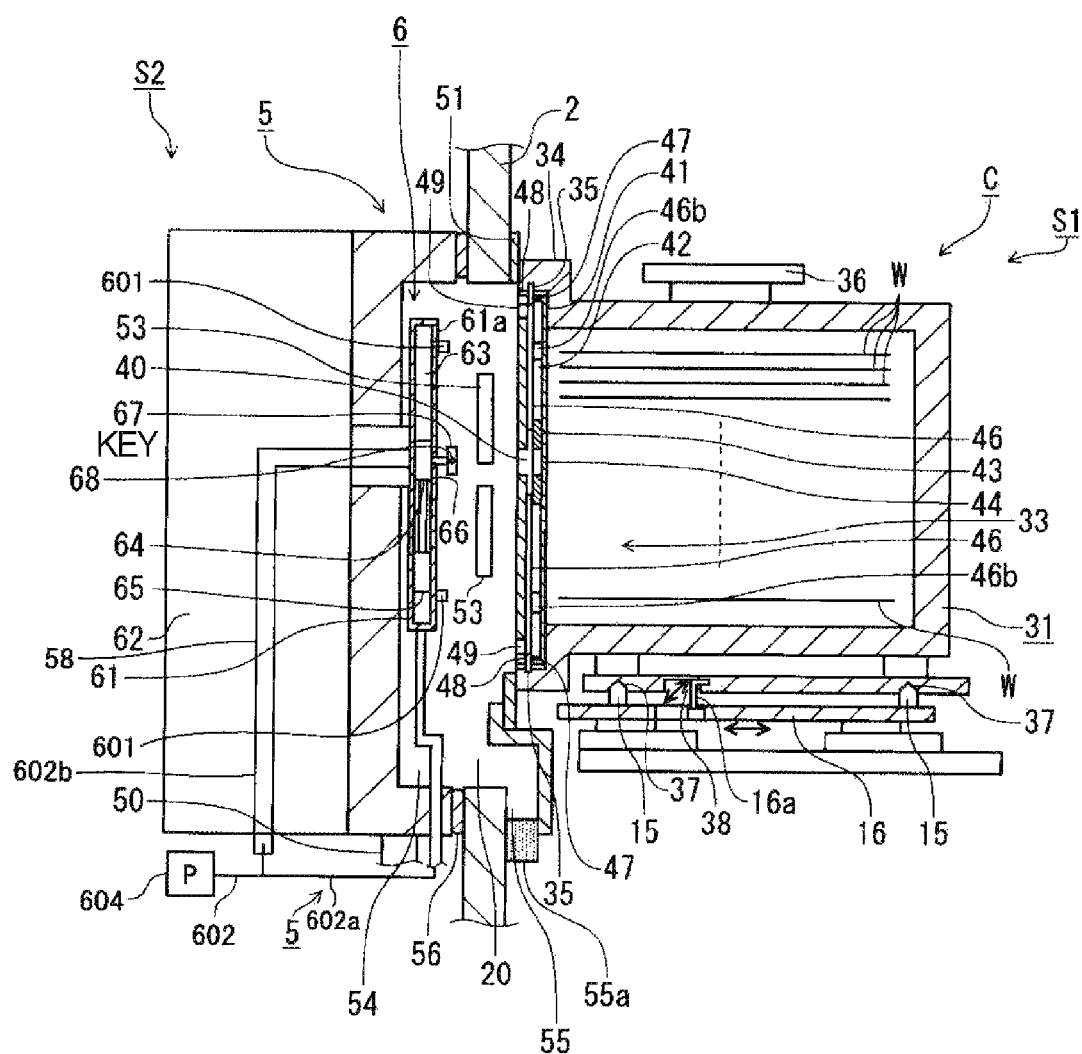
FIG. 3 is a vertical cross-sectional view illustrating a carrier, a wafer transfer port and an opening/closing door of the vertical heat treatment apparatus.
Figure 4:
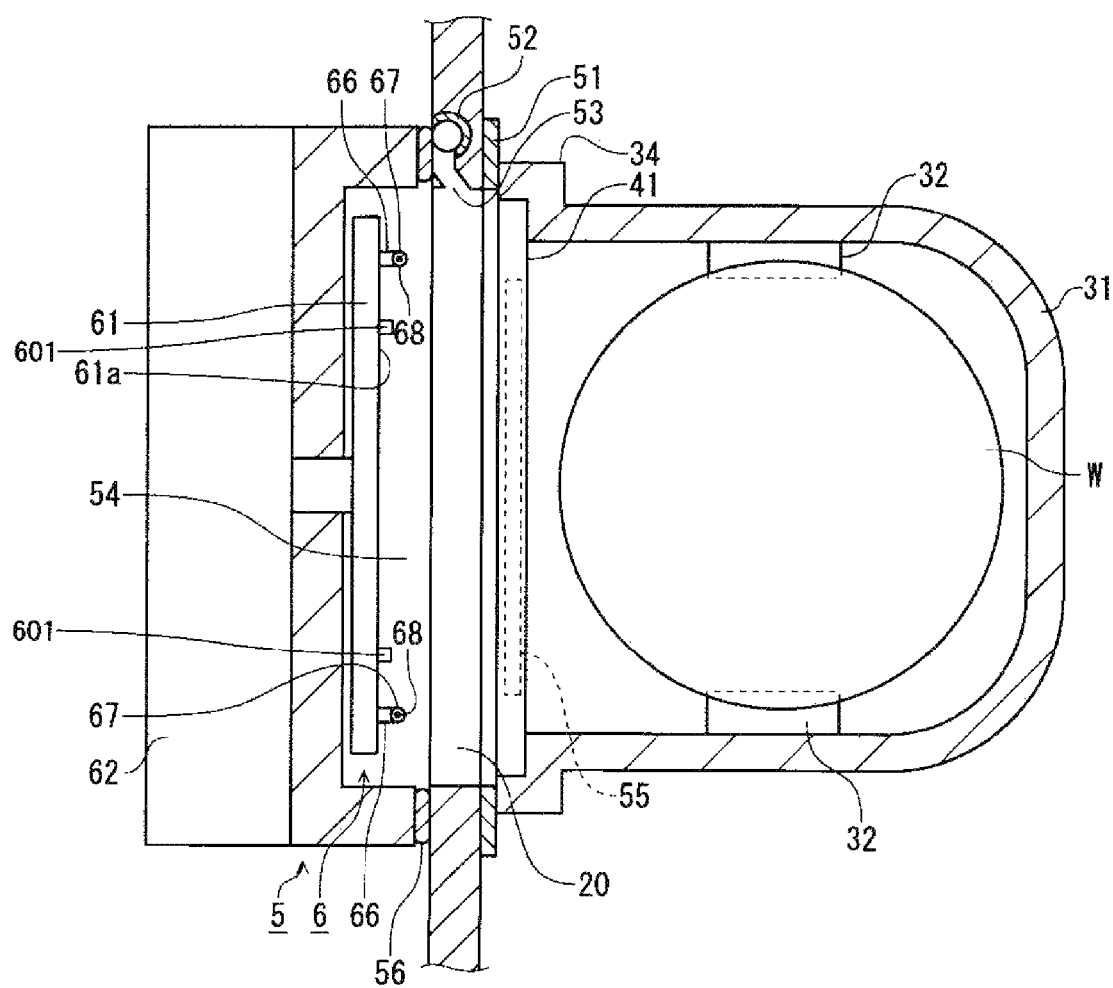
FIG. 4 is a horizontal cross-sectional view illustrating the carrier, the wafer transfer port and the opening/closing door of the vertical heat treatment apparatus.
Figure 5:
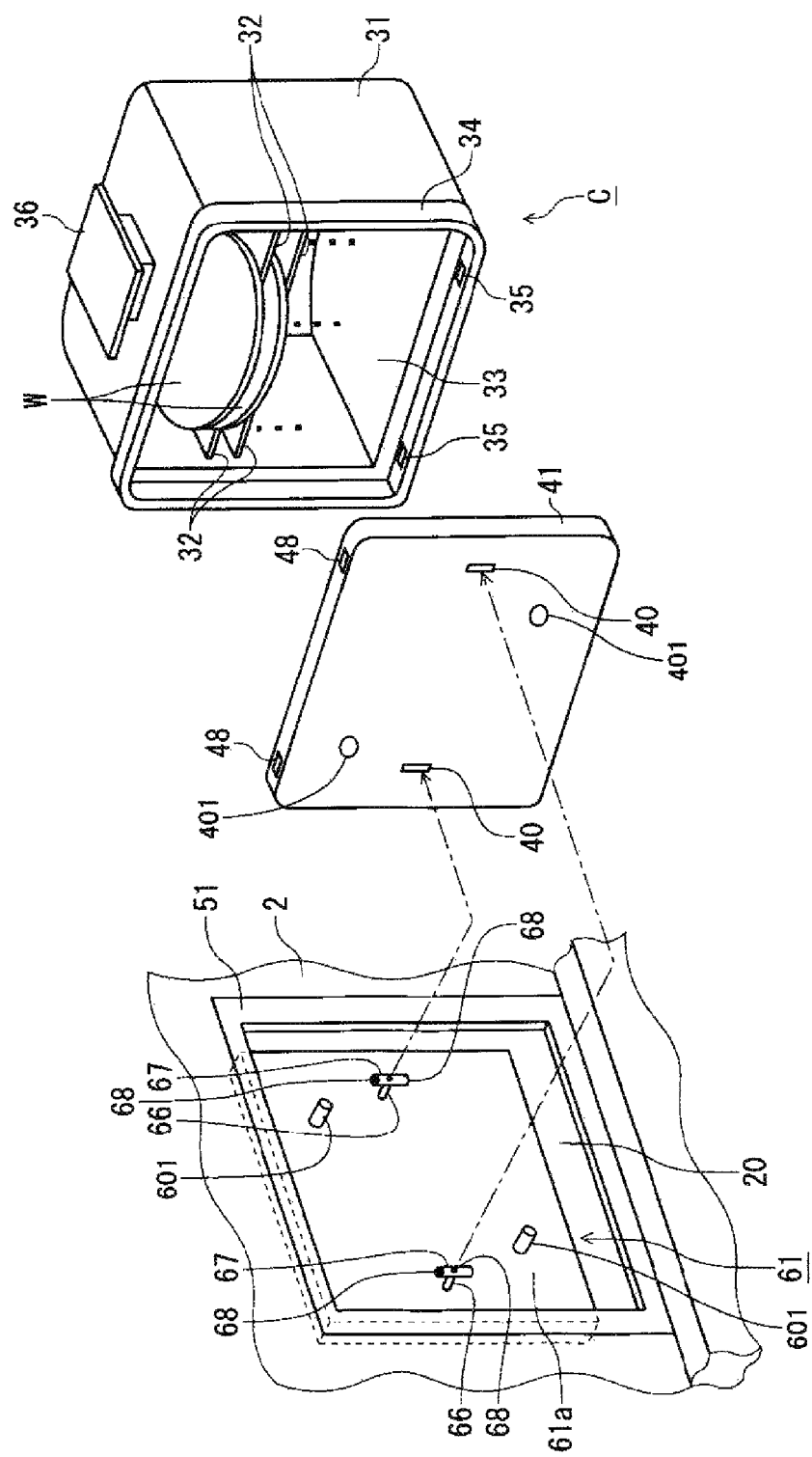
FIG. 5 is a perspective view illustrating the transfer port and the carrier of the vertical heat treatment apparatus.

FIGS. 3 and 4 are a vertical cross-sectional view and a horizontal cross-sectional view, respectively, illustrating a carrier C, the transfer port 20 for wafers W and the opening/closing door 5, and FIG. 5 is a perspective view illustrating the transfer port 20 and the carrier C. FIGS. 3 and 4 illustrate a state where the carrier C has moved to a delivery position to deliver wafers W from/to the wafer transfer region S2 by the carrier placing table 16.

Referring to FIG. 5, a carrier C will be described. The carrier C includes a carrier body 31 as a container body, and a cover 41. At the left and right sides of the carrier body 31, supports 32 are provided in a multistage to support rear peripheral edges of wafers W. At the front side of the carrier body 31, an outlet 33 for wafers W is formed. Further, on the top and bottom of the left and right sides of the inner peripheral portion of an opening edge 34 of the outlet 33 of the wafer W, engaging grooves 35 are formed, respectively.

On the top of the carrier body 31, a gripping unit 36 is provided to grip the carrier C when the carrier transfer mechanism 21 transfers the carrier C. Further, as illustrated in FIG. 3, recesses 37 and a groove 38 are provided on the bottom of the carrier body 31. The recesses 37 are fitted onto the pins 15 of the load port 14 and the carrier placing table 16. The groove 38 is engaged with the hook 16a of the carrier placing table 16 such that the carrier body 31 is fixed on the carrier placing table 16.

Figure 6:
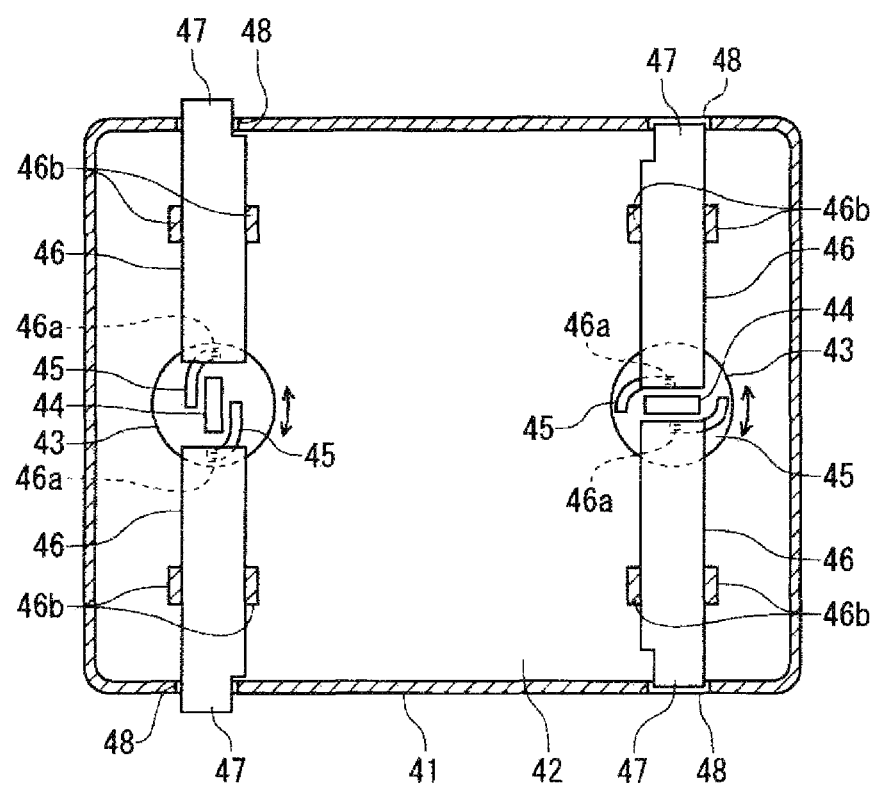
FIG. 6 is a cross-sectional front view illustrating a cover of the carrier.

FIG. 6 is a cross-sectional front view illustrating the cover 41 of the carrier C. As illustrated in FIG. 6, the cover 41 is formed with an internal space 42, and disc-shaped pivoting units 43 configured to pivot around a horizontal axis are provided at the left and right sides of the internal space 42, respectively. Each of the pivoting units 43 is provided with an engagement hole 44 which is engaged with a latch key 67 to be described below, and slits 45. Above and below each pivoting unit 43, linear motion units 46 are provided. Each linear motion unit 46 is provided with a pin 46a at a base end thereof. The pin 46a extends in a thickness direction of the cover 41 and enters the slit 45. When the pivoting unit 43 pivots by 90 degrees, the pin 46a moves in the slit 45 in accordance with the movement of the slit 45 such that the linear motion unit 46 moves up and down, and an engaging unit 47 forming a tip of the linear motion unit 46 moves into and out of the cover 41 through an opening 48 provided in a lateral portion of the cover 41. At that time, the linear motion unit 46 is guided by the guide 46b. When the engaging unit 47 protruding outside the cover 41 is engaged with the engaging groove 35 at the opening edge 34 of the container body 31, the cover 41 is fixed to the container body 31. Further, in FIG. 6, the left engaging unit 47 is illustrated in a state where it protrudes outside the cover 41 so as to lock the cover 41, while the right engaging unit 47 is illustrated in a state where it retracts into the internal space 42 in order to release the locking of the cover 41. In practice, retracting into the internal space 42 or protruding outside the cover 41 is performed in the left and right engaging units 47 at the same time. For example, the carrier C may be provided with such a locking mechanism such that the cover 41 is locked to the cover body 31.

As illustrated in FIG. 5, an insert hole 40 of the latch key 67 is opened on the front side of the cover 41 to be aligned with the engagement hole 44 of the pivoting unit 43 (see FIG. 6). When the latch key 67 is inserted into the insert hole 40 and reaches the engagement hole 44 to rotate the pivoting unit 43, the locking of the cover 41 of the carrier C may be released.

Further, as illustrated in FIG. 5, recesses 41 for alignment are formed on the front side of the cover 41. The recesses 41 are configured such that registration pins 601 on a facing support plate 61 are inserted to align the support plate 61 and the carrier C. The registration pins 601 may be configured in a tubular shape to hold the cover 41 by vacuum suction when the registration pins 601 are inserted into the recesses 401.

Referring to FIG. 4, the configurations of the opening/closing door 5 and the transfer port 20 for wafers W will be described. On the inlet edge of the transfer port 20 at the carrier transfer region S1 side, a seal member S1 is provided at a position where the inlet edge comes in contact with the opening edge 34 of the carrier body 31. Further, at a lateral edge side of the transfer port 20, an $N_2$ gas supply pipe 52 is provided vertically. As illustrated in FIGS. 3 and 4, the $N_2$ gas supply pipe 52 is provided with gas supply ports 53 extending vertically in the upper and lower portions thereof to supply an $N_2$ gas to a closed space 54 surrounded by the opening door 5 and the carrier C at a wafer delivery position. Further, a transversely elongated exhaust port 55 is provided in the lower end portion of the transfer port 20. Reference numeral 55a in FIG. 4 represents a porous body provided in the exhaust port 55 in order to suppress bias of the exhaust gas in the transverse direction.

As illustrated in FIG. 3, the opening/closing door 5 is bent toward the carrier transfer region S1 along the peripheral edge thereof and generally formed as a housing. A seal member 56 is provided on the opening edge of the opening/closing door 5 which constitutes the housing, and the opening/closing door 5 comes in close contact with the transfer port 20 through the seal member 56.

The cover opening/closing mechanism 6 is provided on the carrier transfer region S1 side of the opening/closing door 5 to remove the cover 41. The cover opening/closing mechanism 6 is provided with a facing plate 61 that face the cover 41 and accommodates a driving mechanism of the cover opening/closing mechanism 6. The facing plate 61 is configured to be movable forward and rearward by an advance/retreat mechanism 62. Reference numeral 61a in the drawing denotes a facing surface that faces the cover 41.

A driving mechanism of a mechanical part that drives the cover opening/closing mechanism 6 is accommodated within the facing plate 61. When it is desired, an exhaust line 602 that arrives at the internal space may be provided within the facing plate 61. The exhaust line 602 may be connected to a vacuum pump 604 to exhaust the internal space of the facing plate 61. In FIG. 3, the exhaust line 602 includes two exhaust ports, that is, a lower exhaust port 602a connected to the lower portion of the facing plate 61 and a central exhaust port 602b connected to the central portion of the facing plate 61. The lower exhaust port 602a and the central exhaust port 602, finally join with each other and the exhaust line 602 is connected to the vacuum pump 604. However, as long as the internal space of the facing plate 61 can be exhausted, the exhaust line 602 may be provided in various places which are in communication with the internal space of the facing plate 61. In addition, the number of the exhaust lines 602 may also be variously changed depending on the application thereof.

Further, as illustrated in FIG. 1, the vertical heat treatment apparatus 1 is provided with a control unit 1A which is composed of, for example, a computer. The control unit 1A is provided with a data processing unit including a program, a memory and a CPU. The program incorporates instructions (each step) which send control signals from the control unit 1A to each component of the vertical heat treatment apparatus to proceed each processing as described above. By the control signals, operations such as transfer of a carrier C, transfer of a wafer W, opening/closing of the opening/closing door 5 and supply of an $N_2$ gas into the carrier C are controlled such that the transfer and processing of the wafer W are performed as described below. The program is stored in a storage medium such as, for example, a flexible disc, a compact disc, a hard disc, a magneto-optical disc (MO), and a memory card, and installed in the control unit 1A.

Next, referring to FIGS. 1, 2 and 7 to 10, descriptions will be made on an example of a nitrogen substitution processing in the method for managing an atmosphere in a storage container according to the present exemplary embodiment. Further, the same reference numerals are given to the same components as those described above, and description thereof is omitted. Further, in drawings after FIG. 7, the exhaust line 602 provided in the driving portion of the cover opening/closing mechanism 6 illustrated in FIG. 3 and the vacuum pump 604 connected thereto are not illustrated. However, the exhaust line 602 and the vacuum pump 604 may be provided as desired, as described above with reference to FIG. 3.

In FIGS. 1 and 2, a carrier C is first placed on any of the load ports 14 by an automatic transfer robot (not illustrated) that moves along the ceiling of the clean room. Subsequently, the carrier C is transferred onto the corresponding carrier placing table 16 by the carrier transfer mechanism 21 and fixed to the carrier placing table 16 by the hook 16a, and the carrier placing table 16 moves toward the partition wall 2.

Figure 7:
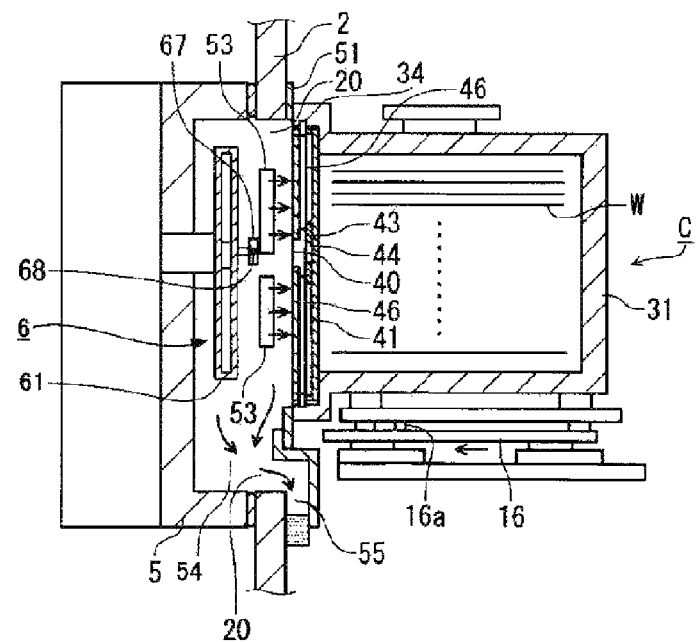
FIG. 7 is a view illustrating a state where the carrier comes in close contact with the transfer port.

FIG. 7 is a view illustrating a state where the carrier C comes in close contact with the corresponding transfer port 20. As illustrated in FIG. 7, when the carrier placing table 16 moves toward the partition wall 2, the opening edge 34 of the carrier C first comes in hermetical contact with the seal member S1 on the inlet edge of the periphery of the transfer port 20 of the partition wall 2.

Subsequently, the $N_2$ gas is supplied to the closed space 54 between the carrier C and the opening/closing door 5 through the gas supply port 53 and exhausted through the exhaust port 55. Accordingly, the air atmosphere is substituted with a nitrogen atmosphere in the closed space 54. Then, the facing plate 61 advances toward the cover 61. The flow rate of the $N_2$ gas is, for example, 160 l/min. This is a flow rate that makes it possible to achieve the nitrogen substitution in the carrier C within a short period of time such as, for example, about 100 sec to about 200 sec. Further, this flow rate will make it possible to reduce the humidity in the carrier C to 5% or less by the nitrogen substitution. In this step, the cover 41 of the carrier C is not removed, but, if the cover 41 is removed, the $N_2$ gas is supplied at a flow rate that makes it possible to achieve the nitrogen substitution for 100 sec to 120 sec. Accordingly, the $N_2$ gas is supplied by being injected through the gas supply port 53. Further, the supply of the $N_2$ gas and the exhaust from the exhaust port 55 are continued in the subsequent operations.

Figure 8:
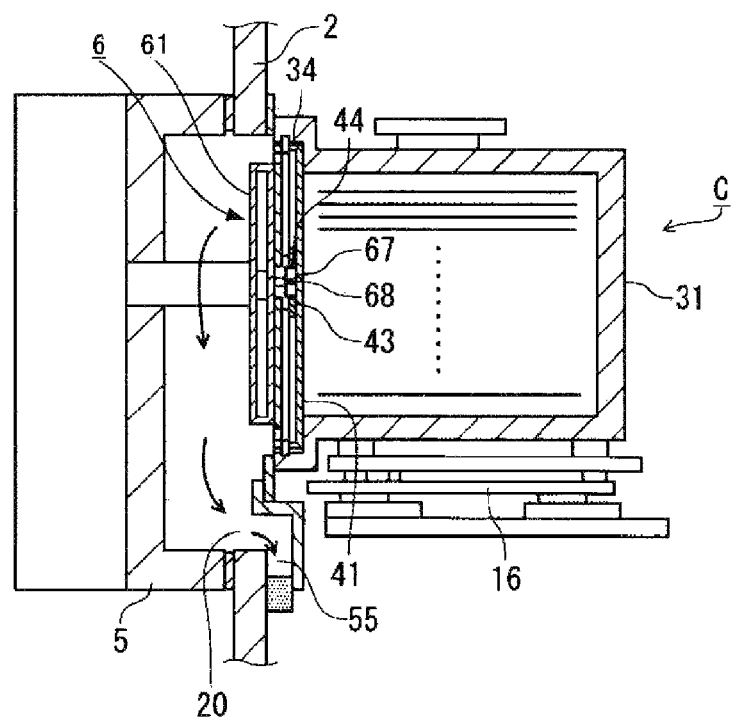
FIG. 8 is a view illustrating a state where a facing plate of a cover opening/closing mechanism comes in contact with the cover.

FIG. 8 is a view illustrating a state where the facing plate 61 of the cover opening/closing mechanism 6 comes in contact with the cover 41. When the facing plate 61 advances and comes in contact with the cover 41, the latch keys 67 enter the internal space 42 of the cover 41 through the insert holes 40 on the front side and are inserted into the engagement holes 44 of the pivoting units 43 to be engaged with the pivoting units 43.

Figure 9:
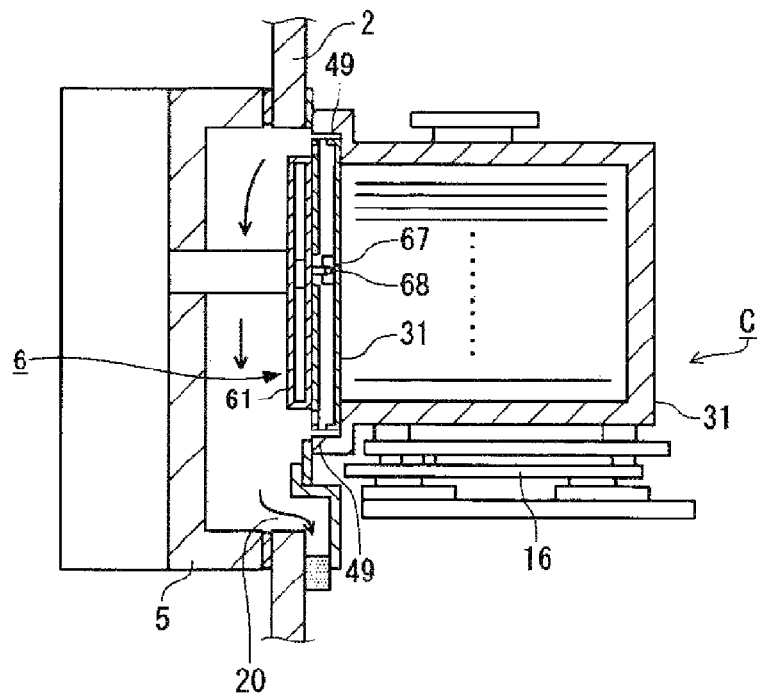
FIG. 9 is a view illustrating a state where the facing plate vacuum-adsorbs the cover such that the cover is fixed to the facing plate.

FIG. 9 is a view illustrating a state where the facing plate 61 vacuum-adsorbs the cover 41 such that the cover 41 is fixed to the facing plate 61. In this state, the keys 67 pivot by 90 degrees such that the pivoting units 43 of the cover 41 pivot, and thus, the engaging units 47 at the tips of the linear motion units 46 are drawn into the cover 41 such that the engagement of the cover 41 and the engagement grooves 35 of the container body 31 is released. As a result, the engagement of the cover 41 with the carrier body 31 is released, and the cover 41 is held by the keys 67.

Figure 10:
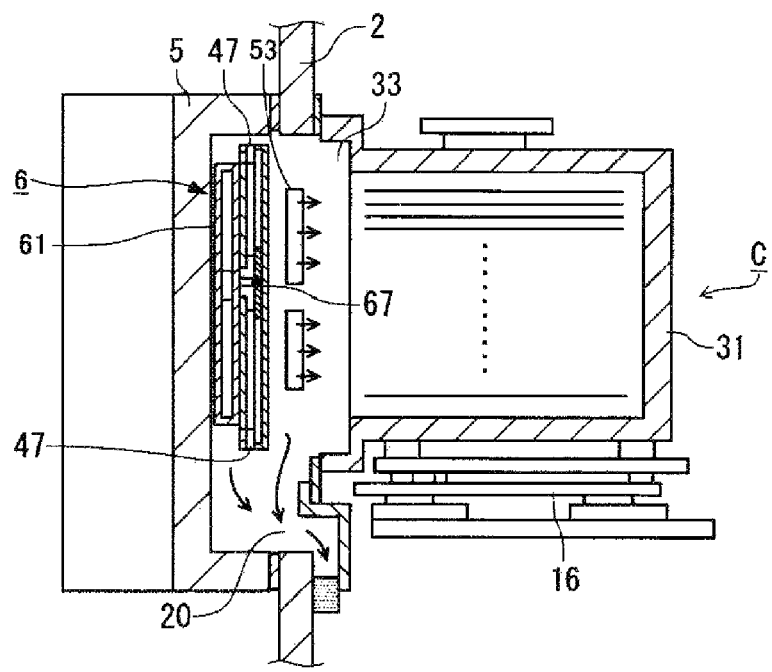
FIG. 10 is a view illustrating a state where the cover is removed.

FIG. 10 is a view illustrating a state where the cover 41 is removed. After the locking of the cover 41 and the carrier body 31 is released, the cover opening/closing mechanism 6 retreats toward the opening/closing door 5 in a state where the cover 41 is held by the latch keys 67 such that the outlet 33 for wafers W in the carrier body 31 is opened.

Here, since the $N_2$ gas is continuously supplied through the gas supply port 53 to form a low oxygen atmosphere, the $N_2$ substitution is achieved within a short period of time. As described above, the flow rate of the $N_2$ gas is about 160 l/min, and the nitrogen substitution in the carrier C is achieved in a short period of time such as, for example, about 100 sec to about 120 sec. Accordingly, the $N_2$ gas is supplied by being injected into the carrier C in which the cover 41 is removed. In this step, the humidity in the carrier C becomes 5% or less. Further, as will be described in detail later, the flow rate of the $N_2$ gas is about 15 l/min in the nitrogen substitution in the carrier keeping rack 18, and takes about 10 minutes to perform the nitrogen substitution in the carrier C. Further, the humidity can be reduced to about 10% at most.

Therefore, according to the method for managing an atmosphere in a storage container of the present exemplary embodiment, by performing the nitrogen substitution in the carrier C using the cover opening/closing mechanism 6, the nitrogen substitution may be performed in a fifth or less of the time required when the nitrogen substitution is performed in the carrier keeping rack 18. Accordingly, the nitrogen substitution may be performed at a high speed.

After the nitrogen substitution in the carrier C is terminated, the outlet 33 for carriers C is covered with the cover 41 and the locking mechanism is locked by performing the operations as described in FIGS. 7 to 9 in reverse order.

Specifically, first, as illustrated in FIG. 9, the facing plate 61 which is holding the cover 41 is moved forward to cover the outlet 33 with the cover 41.

Then, as illustrated in FIG. 8, the latch keys 67 are pivoted by 90 degrees in a direction opposite to the direction when removing the cover 41 to pivot the pivoting units 43 of the cover 41. Accordingly, the engaging units 47 at the tip of the linear motion units 46 protrude from the cover 41 to be engaged with the engagement grooves 35, the cover 41 is fixed to the carrier body 31, and the keys 67 coincide in direction with the insert holes 40 such that the latch keys 67 become detachable from the insert holes 40 (see FIGS. 5 and 6).

Next, as illustrated in FIG. 7, when the facing plate 61 is moved backward, the engagement of the carrier C and the cover opening/closing mechanism 6 is released, and the carrier C becomes transferrable in the carrier transfer region S1.

Further, since the supply of the $N_2$ gas is continued even during the operation that closes the cover 41, the atmosphere when the nitrogen substitution was performed by removing the cover 41 is still maintained.

Therefore, the nitrogen substitution processing in the method for managing an atmosphere in a storage container according to the present exemplary embodiment brings the opening edge 34 of the inlet of the carrier C into close contact with the opening edge of the transfer port 20 to form the sealed closed space 54, and performs the nitrogen substitution in the sealed closed space 54. As a result, the nitrogen substitution may be performed at a high speed, and the humidity may be securely reduced.

Figure 11:
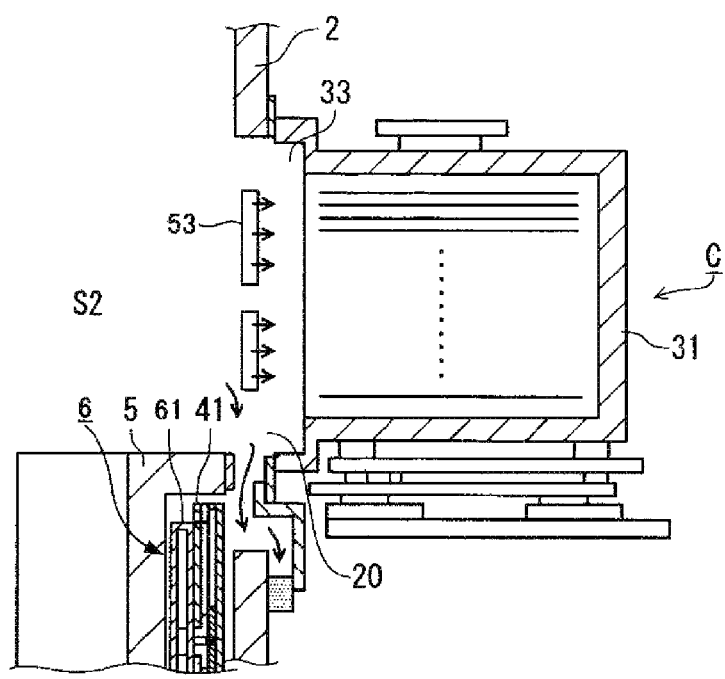
FIG. 11 is a view illustrating an example of a wafer carry-in process.

FIG. 11 is a view illustrating an example of a wafer carry-in process. In the method for managing an atmosphere in a storage container according to the present exemplary embodiment, wafers W are not carried into the wafer transfer region S1 immediately after the nitrogen substitution. However, the wafer carry-in processing will be described herein because the wafers W are eventually transferred to the wafer transfer region S1 and subjected to a processing in the processing apparatus.

In the wafer carry-in processing, after the nitrogen substitution processing is performed in a state where the cover 41 is removed, as described in FIGS. 7 to 10, the carry-in to the wafer transfer region S2 is performed by taking the wafers W out of the outlet 33 which is opened without covering the carrier body 31 with the cover 41.

In the wafer carry-in processing, after the state of FIG. 10, the cover opening/closing mechanism 6 is moved backward. After the cover opening/closing mechanism 6 reaches the inner wall surface of the opening/closing door 5, the opening/closing door 5 is also moved backward integrally with the cover opening/closing mechanism 6. Then, the opening/closing door 5 is moved down to and then moved backward from the transfer port 20, and the inside of the carrier C is opened to the wafer transfer region S2 as illustrated in FIG. 11.

And, as illustrated in FIG. 1, the wafers W in the carriers C are sequentially taken out by the wafer transfer mechanism 27 and transferred to the wafer boat 23. When the carrier C is empty of the wafers W, the cover 41 of the carrier C is closed and fixed to the carrier body 31 by performing the operations as described above in reverse order. Thereafter, as the carrier placing table 16 is moved backward to separate the carrier C from the partition wall 2 and the carrier C is transferred to the carrier keeping rack 18 by the carrier transfer mechanism 21 and kept temporarily thereon.

Meanwhile, the wafer boat 23 loaded with the wafers W is carried into the heat treatment furnace, and the wafers W are subjected to a heat treatment such as, for example, CVD, an annealing process and an oxidation process. Thereafter, even when the completely processed wafers are returned to the carrier C, the cover 41 is opened in the same manner as when the wafers W are taken out from the carrier C. After the cover 41 is opened, the processed wafers W are sequentially returned to the carriers C by the wafer transfer mechanism. Then, the cover 41 is closed, and the wafers W stored in the carriers C are placed and kept in the carrier keeping racks 18 using the carrier transfer mechanism 21. The processing after the wafer transfer processing is performed in this order, for example.

Figure 12:
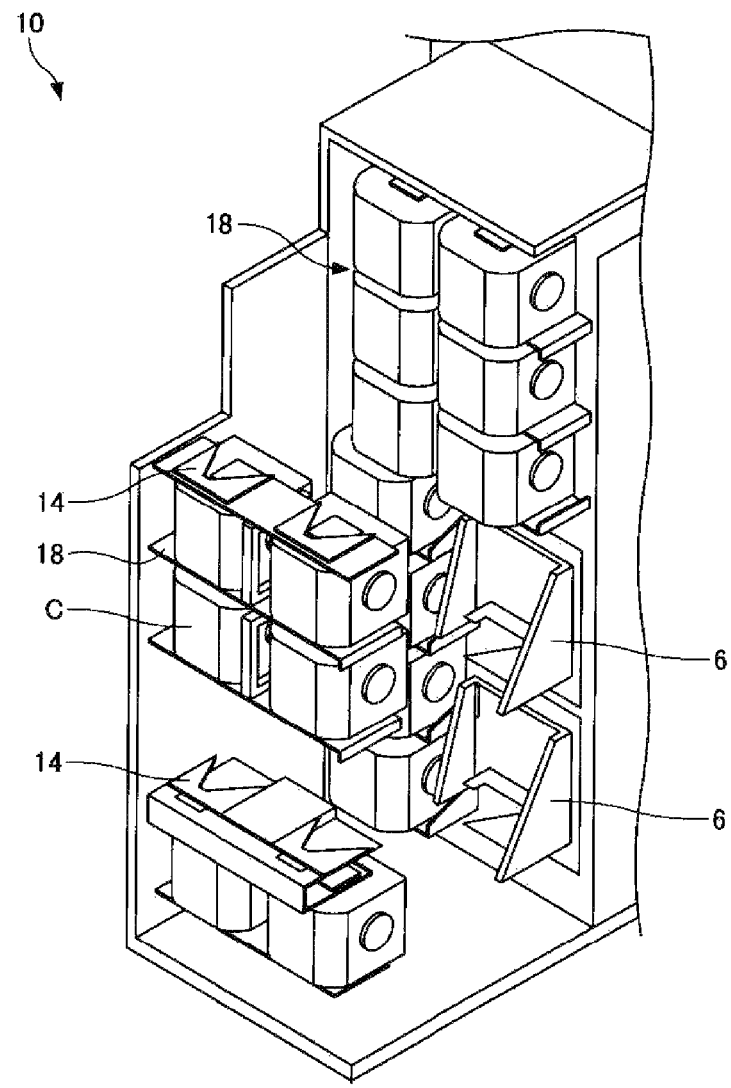
FIG. 12 is a perspective view illustrating an example of a vertical heat treatment apparatus suitable to perform the method for managing an atmosphere in a storage container according to an exemplary embodiment of the present disclosure.

FIG. 12 is a perspective view illustrating an example of a vertical heat treatment apparatus suitable to perform the method for managing an atmosphere in a storage container according to the present exemplary embodiment. The vertical heat treatment apparatus 10 as illustrated in FIG. 10 is different in that two cover opening/closing mechanisms 6 are disposed to be arranged vertically rather than horizontally, and that the number of tiers in the carrier keeping rack 18 is increased. However, since the respective components are the same as those described so far, descriptions will be made with the same reference numerals.

In FIG. 12, the vertical heat treatment apparatus 10 has four (4) load ports 14 which are arranged horizontally in two (2) rows in each of the lower and upper tiers, respectively. The cover opening/closing mechanisms 6 are disposed vertically in two (2) tiers at slightly lower and higher positions than the load ports 14. Further, the carrier keeping racks 18 are provided as follows. A total of six (6) carrier keeping racks 18 are provided in such a manner that two tiers and two rows of carrier keeping racks are provided between the upper and lower load ports 14, and in one tier and two rows of carrier keeping racks are provided under the lower load port 14. In addition, three (3) tiers of carrier keeping racks are provided above the cover opening/closing mechanism 6 and seven tiers of carrier keeping racks are provided in the next row. That is, the vertical heat treatment apparatus 10 is provided with two (2) cover opening/closing mechanisms 6, sixteen (16) carrier keeping racks 18 corresponding to sixteen (16) carriers C, and four (4) load ports 14.

Hereinafter, the method for managing an atmosphere in a storage container according to the present exemplary embodiment will be described with reference to an example of the vertical heat treatment apparatus 10 as illustrated in FIG. 12.

Figure 13:
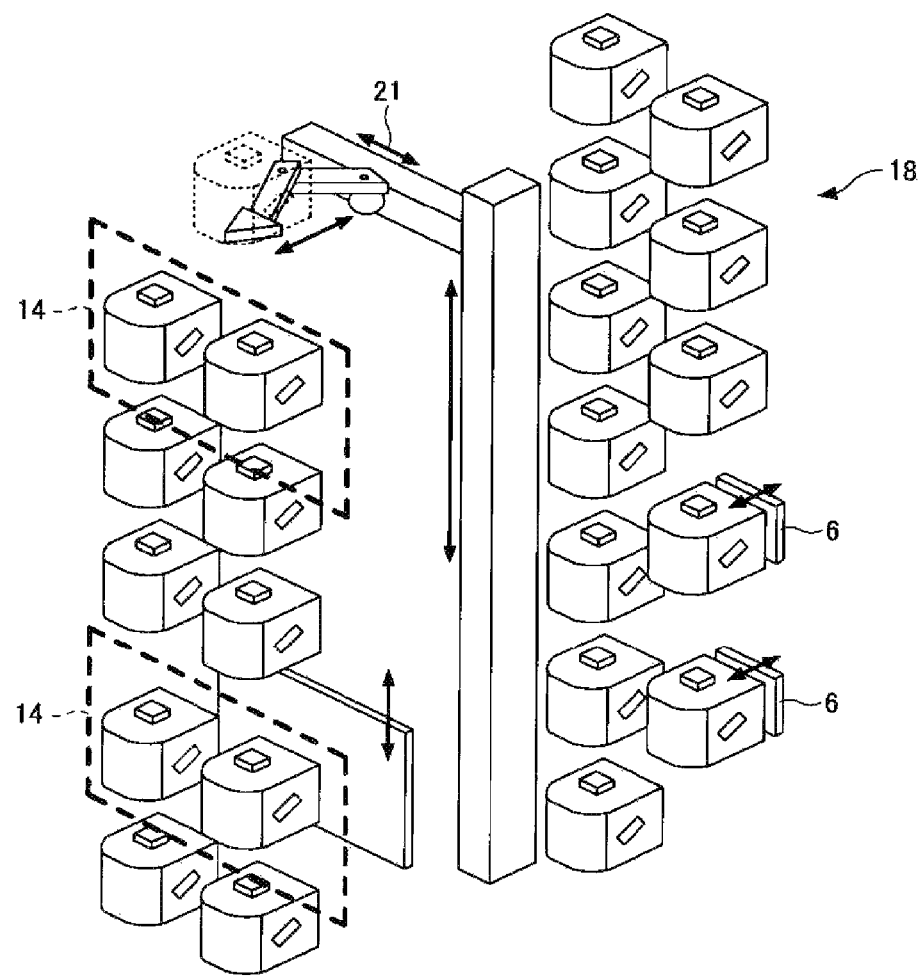
FIG. 13 is a simplified view of the vertical heat treatment apparatus illustrated in FIG. 12.

FIG. 13 is a simplified view of the vertical heat treatment apparatus illustrated in FIG. 12. Except for the carrier transfer mechanism 21, FIG. 13 is the same as FIG. 12, and thus, the descriptions thereof will be omitted.

FIGS. 14A to 14I are views for describing a sequence of an example of the method for managing an atmosphere in a storage container according to an exemplary embodiment of the present disclosure. FIGS. 14A to 14I further simplify FIG. 13 and illustrate individual components by depicting the positions where the carriers C may be placed as square frames. Thus, it would be desirable to refer to FIG. 13 if necessary. Further, reference numerals given to the individual components are the same as those in FIG. 13. Further, in FIG. 14, in order to facilitate understanding, the humidity in each of the carriers C is indicated using the following symbols. That is, a state for a carrier C immediately after carried into the vertical heat treatment apparatus 10 where the humidity in the carrier C is 40% to 45% is indicated by "○", a state for a carrier C while being subjected to nitrogen substitution where the humidity in the carrier C is 10% to 30% is indicated by " ", and a state for a carrier C after completion of the nitrogen substitution where the humidity in the carrier C is maintained below 10% is indicated by "●".

Figure 14A:
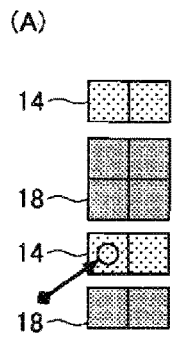
FIGS. 14A to 14I are views for describing a sequence of an example of the method for managing an atmosphere in a storage container according to an exemplary embodiment of the present disclosure.

FIG. 14A is a view illustrating a state where the carrier C is introduced into the load port 14. FIG. 14A illustrates a state where a carrier C is carried into one of the load ports 14 at the lower tier. When a carrier C accommodating wafers W is carried into a load port 14, the humidity in the carrier C often ranges 40% to 45%. In this step, using the supply nozzle 19a and the exhaust nozzle 19b as illustrated in FIG. 2, the nitrogen substitution within the carrier C is started. Accordingly, the humidity in the carrier C begins to decrease in the load port 14 and begins to progress toward a state of 10% to 30%. Further, this step may be called a temporary nitrogen substitution process.

Meanwhile, when a carrier C is placed in a load port 14, it is confirmed whether a cover opening/closing mechanism 6, that is, a FIMS port is empty or not. Further, the confirmation as to whether a cover opening/closing mechanism 6 is empty or not may be performed, for example, by providing a detection unit such as a mechanical detector (e.g., a limit switch) or an optical detection unit using laser in the carrier placing tables 16 and detecting whether another carrier C has already been placed on a carrier placing table 16.

Further, when a carrier C is placed in a load port 14, the nitrogen substitution is not always essential, but may be performed as desired. In this case, the confirmation as to whether a cover opening/closing mechanism 6 is empty or not is performed in a state where the carrier C is placed in the load port 14 without performing the nitrogen substitution in the carrier C. In this case, the present process may be called a carrier carry-in process.

Figure 14B:
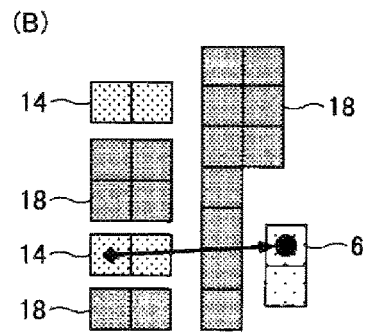

FIG. 14B is a view illustrating a state where the nitrogen substitution process has been performed. In the state of FIG. 14A, when it is determined that another carrier C is not present on the carrier placing table 16, the carrier C which has been carried into the load port 14 is transferred to a position at which the cover 41 is removable by the cover opening/closing mechanism 6, that is, onto the carrier placing table 16. Then, the nitrogen substitution as described with reference to FIGS. 7 to 10 is performed. As a result, the internal atmosphere of the carrier C is substituted with nitrogen at a high speed, and the atmosphere in the carrier C becomes a state where the humidity is 10% or less.

Figure 14C:
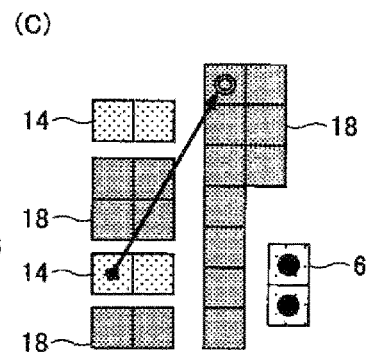

FIG. 14C is a view illustrating a state where the carrier is transferred from the load port 14 to a carrier keeping rack 18. In the state of FIG. 14A, when it is determined that another carrier C is present on each of the carrier placing tables 16, the carrier C is first transferred to a carrier keeping rack 18 and waits until any of the carrier placing table 16 is empty. Since the carrier keeping rack 18 also has a function to perform nitrogen substitution at a low speed, the nitrogen substitution is performed on the carrier C placed on the carrier keeping rack 18 (this will be described in detail below). Accordingly, while the carrier C is placed on the carrier keeping rack 18, the humidity in the carrier C is reduced to, for example, about 10% to 30%.

The carrier C waits in the state of FIG. 14C, and when a carrier placing table 16 is empty and high-speed nitrogen substitution by the cover opening/closing mechanism 6 is enabled, the carrier C is transferred to the carrier placing table 16 and subjected to the nitrogen substitution process as described in FIG. 14B.

Figure 14D:
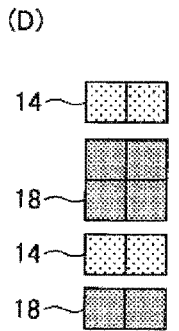

FIG. 14D is a view illustrating an example of a carrier keeping process and an atmosphere maintenance process. In the carrier keeping process, the nitrogen substitution process is terminated, and the carrier C which has been subjected to the nitrogen substitution is transferred to and placed on a carrier keeping rack 18 which is empty. As described above, since nitrogen is supplied to the carrier C placed on the carrier keeping rack 18, the internal space of the carrier C is filled with nitrogen and maintained in the state where it is substituted with nitrogen by the cover opening/closing mechanism 6. As a result, in the atmosphere maintenance process, the humidity in the carrier C may be maintained below 10%.

Figure 14E:
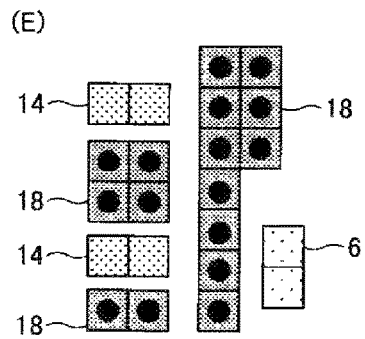

FIG. 14E is a view illustrating a state where the carrier keeping racks 18 are filled. When the procedure from FIG. 14A to FIG. 14D are repeated and the carriers C on which the nitrogen substation process has been completed are sequentially kept and maintained on the empty carrier keeping racks 18, the carriers C in which the humidity is maintained below 10% may be placed on all the carrier keeping racks 18. The carriers C wait processings in the processing apparatus in this state.

Figure 14F:
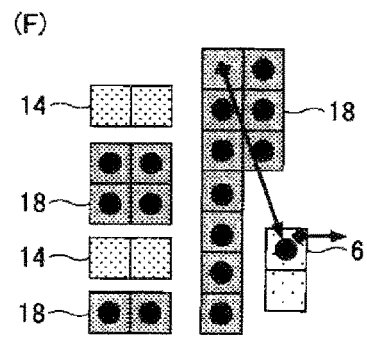

FIG. 14F is a view illustrating an example of a carrier movement process. In the carrier movement process, among the carriers C placed and kept on the carrier keeping racks 18, a carrier C that stores wafers W to be introduced into the wafer transfer region S1 of the processing apparatus is moved to the carrier placing table 16 of a cover opening/closing mechanism 6. Then, the cover removal operation, the nitrogen substitution and the wafer carry-in operation as described above with reference to FIGS. 7 to 11 are subsequently performed. Then, the wafers W are introduced into the wafer transfer region S1.

Further, the vertical heat treatment apparatus 10 may perform a batch type processing and the wafers W stored in a plurality of carriers C may be introduced into the heat treatment furnace 22 as a processing container at once so as to process all the wafers W at once. In this case, in order to avoid a state where the wafers W are placed to be exposed for a long period of time in the wafer transfer region S1, it is desirable to introduce the wafers W in the plurality of carries C successively into the wafer transfer region S1, then to transfer the wafers W to the wafer boat 23, and when all the wafers W are transferred to the wafer boat 23, to rapidly carry the wafers W into the heat treatment furnace. Accordingly, carriers C corresponding to the number of wafers W to be processed in the heat treatment furnace 22 at one time are successively installed on the carrier placing tables 16, and the wafers W are sequentially introduced into the heat treatment furnace. For example, in a case where 100 sheets of wafers W can be processed in the heat treatment furnace 22 at one time and 25 sheets of wafers W can be stored in each of the carriers C, it is desirable to successively introduce the wafers W stored in four carriers C. Accordingly, any wafer introduction method suitable for various apparatus may be employed, or the successive introduction of the wafers W as described above may be performed as desired.

Further, a carrier C which becomes empty as the wafers W have been introduced into the wafer transfer region S1 is returned to a carrier keeping rack 18. At this time, since the high-speed nitrogen substitution as described with reference to FIGS. 7 to 11 is being performed, the humidity in the empty carrier C is also maintained at 10% or less.

Figure 14G:
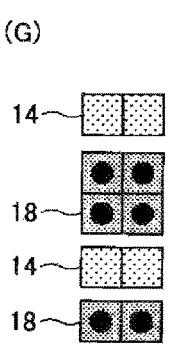

FIG. 14G is a view illustrating an example of a process step. In the process step, the heat treatment of the wafers W is performed in the heat treatment furnace 22. As described in FIG. 14F, since the humidity in a carrier C which becomes empty is maintained below 10%, all the carriers C that are waiting or empty are in a state where the humidity is 10% or less.

Figure 14H:
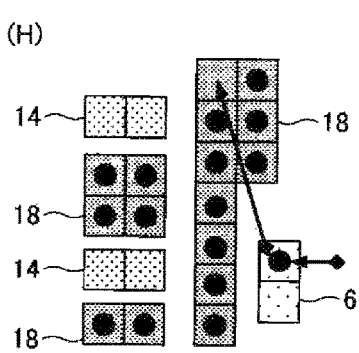

FIG. 14H is a view illustrating an example of a wafer carry-out process. In the wafer carry-out process, the wafers W which have subjected to the heat treatment are returned to the carriers C by the cover opening/closing mechanisms 6, and carried out from the wafer transfer region S1. At that time, since the high-speed nitrogen substitution is also performed by the cover opening/closing mechanisms 6, the humidity in the carriers C which accommodate the wafers W is also maintained at 10% or less.

Further, the carriers C which accommodate the processed wafers W are transferred to empty carrier keeping racks 18 by the carrier transfer mechanism 21.

Figure 14I:
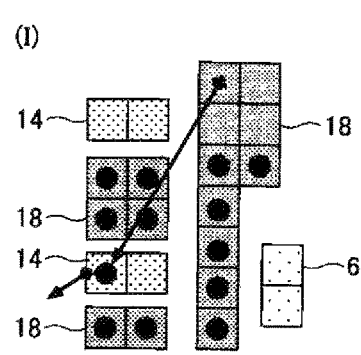

FIG. 14I is a view illustrating an example of a carrier carry-out process. In the carrier carry-out process, the carriers C that accommodate the processed wafers W are carried out of the vertical heat treatment apparatus 10. The carry-out of the carriers C is performed in such a manner that the carriers C are transferred to the load ports 14 by the carrier transfer mechanism 21, and carried out of the vertical heat treatment apparatus 10 from the load ports 14. Also in the load ports 14, the low-speed nitrogen substitution is performed in the same manner as in the carrier keeping racks 18, and thus, the inside of the carriers C may be maintained in a state where the low-speed nitrogen substitution is being performed until just prior to carry-out of the carriers C. Accordingly, the carriers C may be carried out in a state where the humidity is 10% or less.

As such, according to the method for managing an atmosphere in a storage container of the present exemplary embodiment, the humidity in carriers C may be reduced at a high speed by performing high-speed nitrogen substitution using a cover opening/closing mechanism 6 and then putting the carriers C on standby on the carrier keeping racks 18. Further, by combining the high-speed nitrogen substitution using the cover opening/closing mechanism 6 and the low-speed nitrogen substitution in the load ports 14 and the carrier keeping racks 18, the humidity management in the carriers C may be performed more effectively. However, as described above, the low-speed nitrogen substitution in the load ports 14 is not essential, and may be performed as desired. However, from the viewpoint of the humidity management in the carriers C, it is desirable to perform a low-flow rate nitrogen substitution in both of the load ports 14 and the carrier keeping racks 18. Since the carriers C are not completely sealed, it is desirable to continuously perform the nitrogen substitution in order to maintain a low humidity in the carriers C even after the high-speed nitrogen substitution using the cover opening/closing mechanism 6. Therefore, it is desirable to continue the nitrogen substitution in the load ports 14 and the carrier keeping racks 18 as well. Further, in order to continuously maintain a low humidity in the carriers C, a flow rate of 1 l/min or more is required.

In FIGS. 14A to 14I, in order to facilitate understanding, descriptions has been made on an example in which only one of two cover opening/closing mechanisms 6 is operated. However, since the two cover opening/closing mechanisms 6 are able to be operated in parallel, each of the cover opening/closing mechanisms 6 may be operated to perform a series of processes such as, for example, the nitrogen substitution process, the keeping process, and the atmosphere maintenance process in parallel. Further, in FIGS. 12 and 13 and FIGS. 14A to 14I, two or more cover opening/closing mechanism 6 may be provided and configured to be operated in parallel to each other to perform each of the processes such as, for example, the nitrogen substitution process, the keeping process, the atmosphere maintenance process separately.

Next, referring to a flowchart, descriptions will be made on a processing flow of the method for managing an atmosphere in a storage container according to the present exemplary embodiment.

Figure 15:
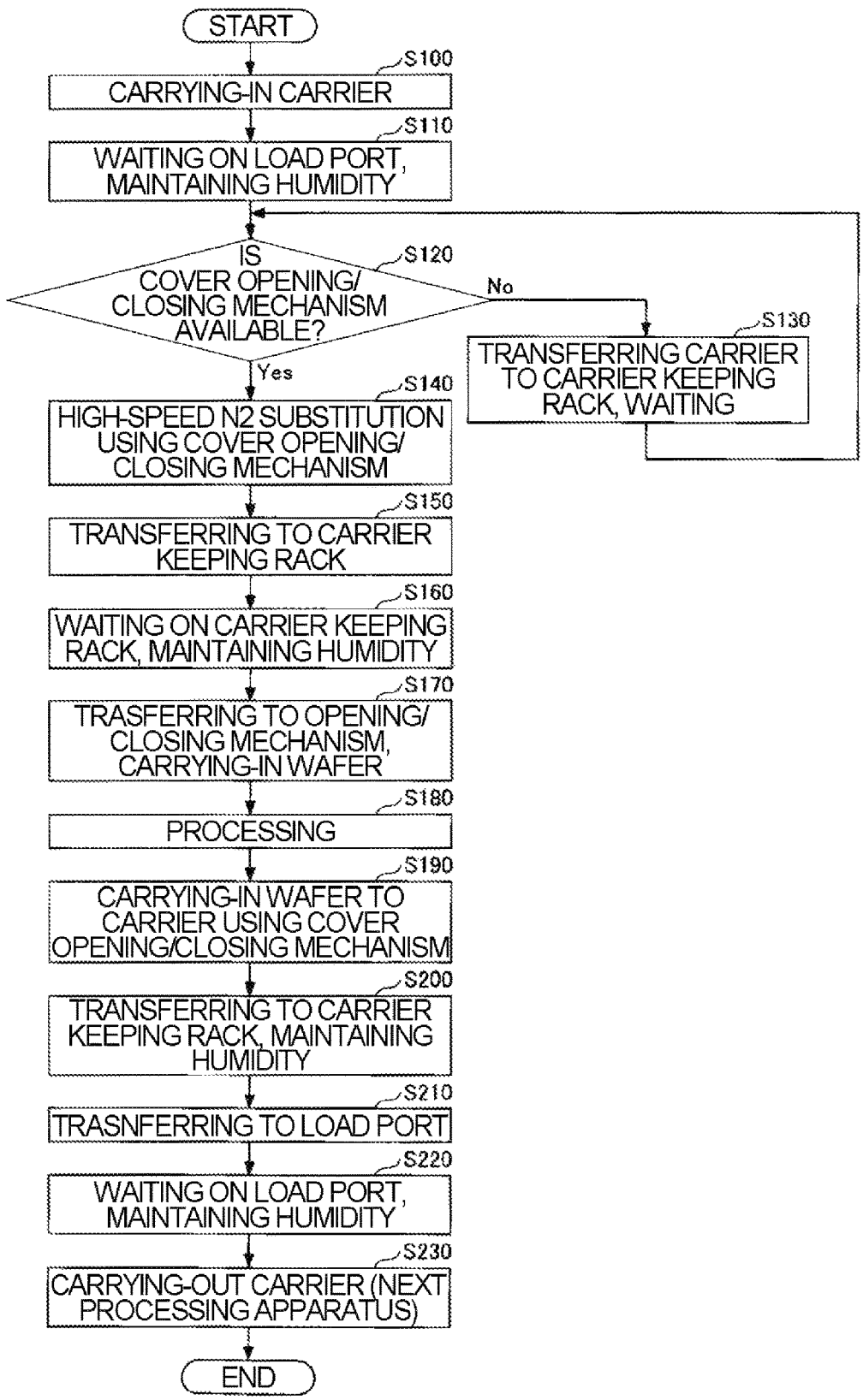
FIG. 15 is a processing flowchart illustrating an example of the method for managing an atmosphere in a storage container according to the present exemplary embodiment.

FIG. 15 is a processing flowchart illustrating an example of the method for managing an atmosphere in a storage container according to the present exemplary embodiment. Further, the same reference numerals are given to the same components as those described above, and descriptions thereof will be omitted.

In step S100, a carrier C is carried into a load port 14. Further, when the carrier C is carried into the load port 14, the humidity in the carrier C is, for example, about 40% to 45%.

In step S110, the carrier C waits on the load port 14. In this state, $N_2$ gas is supplied into the carrier C by a supply nozzle 19a and an exhaust nozzle 19b provided in the load port 14 so as to perform a low speed nitrogen substitution in the carrier C. Further, the low speed nitrogen substitution requires a flow rate of, for example, 1 l/min or more, and may be performed by supplying nitrogen at a flow rate of preferably 10 l/min to 20 l/min, more preferably 13 l/min to 17 l/min, and still more preferably 15 l/min. By such a low nitrogen substitution, the humidity in the carrier C becomes, for example, 10% to 30%, or approaches the range.

In step S120, it is determined whether a cover opening/closing mechanism 6 is available. Further, the determination as to whether the cover opening/closing mechanism 6 is available may be made based on, for example, a determination as to whether another carrier C has already been placed on a carrier placing table 16. Whether another carrier C has already been placed on the carrier placing table 16 may be easily detected by using a mechanical detector such as a limit switch or an optical detector such as laser. Further, such a determination process may be performed in the control unit 1A, for example, by inputting a detection signal output from a detector to the control unit 1A.

In step S120, when it is determined that the cover opening/closing mechanism 6 is available, the process proceeds to step S140, and when it is determined that the cover opening/closing mechanism 6 is not available, the process proceeds to step S130.

In step S130, the carrier C is transferred from the load port 14 to a carrier keeping rack 18 and stands by until the cover opening/closing mechanism 6 becomes available. Further, in the carrier keeping rack 18, nitrogen gas may be supplied through a bottom hole of the carrier C to perform a low-speed nitrogen substitution. The low-speed nitrogen substitution requires a flow rate of, for example, 1 l/min or more, and may be performed by supplying nitrogen at a flow rate of preferably 10 l/min to 20 l/min, more preferably 13 l/min to 17 l/min, and still more preferably 15 l/min.

After circulating step S130 and step S120, if the cover opening/closing mechanism 6 becomes available in step S120, the process proceeds to step S140.

In step S140, a nitrogen substitution process is performed. Specifically, the inside of the carrier C is substituted with nitrogen at a high speed by the cover opening/closing mechanism 6. The high-speed nitrogen substitution using the cover opening/closing mechanism 6 is performed by removing the cover 41 in a closed space formed by an opening/closing door 61 and the carrier C and injecting $N_2$ gas from a gas supply port 53 to the carrier C. When the $N_2$ gas is supplied at a high flow rate of, for example, 50 l/min to 200 l/min, preferably 100 l/min to 200 l/min, more preferably 130 l/min to 180 l/min, and still more preferably 160 (1 l/min), the nitrogen substitution is performed in a short period of time such as, for example, 100 sec to 120 sec, and the humidity in the carrier C is reduced to 10% or less. That is, in the nitrogen substitution process, the nitrogen substitution is performed at a nitrogen supply flow rate which is three or more times, preferably five or more times, more preferably eight or more times, and still more preferably at least ten or more times higher than that in the nitrogen substitution in the carrier keeping rack 18. As a result, the nitrogen substitution is performed in a short period of time such as ¼ or less, preferably ⅕ or less of the time of the nitrogen substitution in the carrier keeping rack 18.

Further, the humidity is reduced by the nitrogen substitution because water molecules in the carrier C are expelled outside by the nitrogen substitution.

In step S140, when the nitrogen substitution is terminated, the cover 41 is attached by the cover opening/closing mechanism 6 without performing the carry-in of wafers W. Accordingly, the inside of the carrier C is substituted with nitrogen, and the carrier C is sealed in a state where the humidity is 10% or less.

In step S150, the carrier C of which the atmosphere has been substituted with nitrogen is transferred from the carrier placing table 16 to the carrier keeping rack 18 and placed thereon. Further, the transfer of the carrier C may be performed by the carrier transfer mechanism 21.

In step S160, nitrogen gas is supplied at a low speed to the inside of the carrier C transferred to the carrier keeping rack 18, and the humidity is maintained at 10% or less. The carrier C is on standby in this state, and wait for the next process.

In step S170, a carrier C that accommodates wafers W to be processed next is transferred to the carrier placing table 16, the cover 41 of the carrier C is opened by the cover opening/closing mechanism 6, and the wafers W are carried into the wafer transfer region S1.

In step S180, the wafers W carried into the wafer transfer region S1 are processed. Although the vertical heat treatment apparatuses 1, 10 perform a heat treatment, other processing apparatuses should perform a processing to be performed therein.

In step S190, the processed wafers W are carried into the carrier C by the cover opening/closing mechanism 6. Since the cover opening/closing mechanism 6 is also used in this case, the nitrogen substitution is performed sufficiently in the carrier C, and the humidity is maintained at 10% or less.

In step S200, the carrier C that accommodates the processed wafer W is transferred to a carrier keeping rack 18 by the carrier transfer mechanism 21. As described above, since the low-speed nitrogen substitution is performed in the carrier keeping rack 18, the humidity in the carrier C is maintained at 10% or less.

In step S210, the carrier C is transferred from the carrier keeping rack 18 to a load port 14.

In step S220, the low-speed nitrogen substitution is performed in the inside of the carrier C. The low-speed nitrogen substitution may be the same as the nitrogen substitution performed in the carrier keeping rack 18. Accordingly, for inside of the carrier C, the nitrogen substitution stops only during the transfer of the carrier C in step S210, but the low-speed nitrogen substitution is performed again as soon as the carrier C is placed in the load port 14. Therefore, the humidity in the carrier C may be maintained at 10% or less.

In step 230, the carrier that accommodates the processed wafers W is carried out from the apparatus and transferred to the next processing apparatus.

As such, according to the method for managing an atmosphere in a storage container of the present exemplary embodiment, a carrier carried into the carrier transfer region S1 is subjected to the high-speed nitrogen substitution and then is on standby for a processing in a carrier keeping rack 18. Thus, wafers managed at a low humidity may be processed without lowering the throughput, and as a result, the processing quality of wafers W can be enhanced while maintaining the high throughput.

Further, the low-speed nitrogen substitution in the carrier keeping rack 18 may be preferably performed in order to securely manage the atmosphere in the carrier C formed in the high-speed nitrogen substitution process, but it is not always essential. For example, in a case of an apparatus in which the period of keeping a carrier in a carrier keeping rack 18 is short, the low-speed nitrogen substitution may be performed as desired.

Similarly, the low-speed nitrogen substation in the load port 14 is not always essential, and may be performed as desired. However, from the viewpoint of rapidly starting the nitrogen substitution and securely maintaining the carrier C at a low humidity of 10% or less until just prior to carrying out the carrier C, it is desirable to additionally perform the low-nitrogen substitution in the load port 14.

Further, a series of sequences illustrated in FIGS. 14A to 14I and FIG. 15 may be executed by the control unit 1A illustrated in FIG. 1.

Next, referring to FIGS. 16 to 18, descriptions will be made on an example of a mechanism that performs the low-speed nitrogen substitution of a carrier keeping rack 18.

Figure 16:
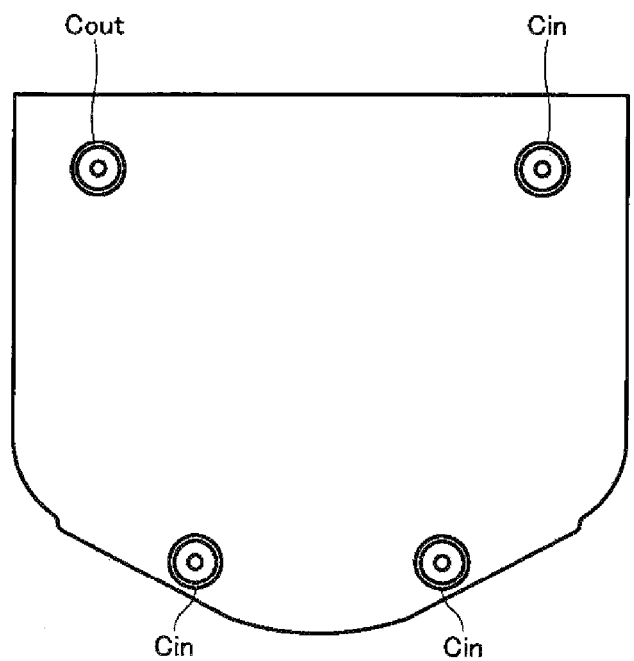
FIG. 16 is a view illustrating a configuration of an example of a bottom surface of the carrier.

FIG. 16 is a view illustrating a configuration of an example of a bottom of a carrier C. As for the carrier C, various configurations may be used depending on an application thereof, but a carrier having an intake port Cin and an exhaust port Cout as illustrated in FIG. 16 is commonly used. When nitrogen gas is supplied from the intake port Cin and exhausted from the exhaust port Cout, the nitrogen substitution in the carrier C may be performed. However, since the intake port Cin and the exhaust port Cout in the carrier C are small openings provided in the bottom of the carrier C, it is difficult to perform the nitrogen substitution in a short period of time while allowing the nitrogen gas to flow in a high flow rate. Accordingly, in the method for managing an atmosphere in a storage container according to the present exemplary embodiment, the intake port Cin and the exhaust port Cout provided in the bottom of the carrier C are used only for the low-speed nitrogen substitution in the carrier keeping rack 18. Since the intake port Cin and the exhaust port Cout provided in the carrier are used effectively, the atmosphere inside the carrier C can be securely managed.

FIG. 16 illustrates three intake ports Cin and one exhaust port Cout. However, it is not always essential to use all the intake ports Cin, and intake ports Cin suitable for an application may be used as desired.

Figure 17B:
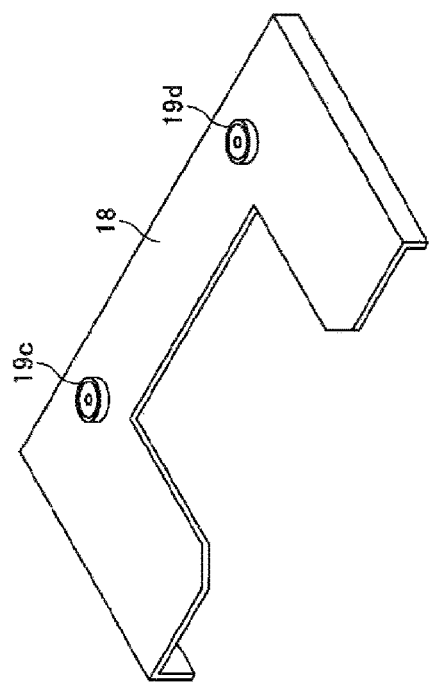
FIGS. 17A to 17D are views for describing a low-speed nitrogen substitution mechanism in the carrier keeping rack of the vertical heat treatment apparatus according to the present exemplary embodiment.
Figure 17D:
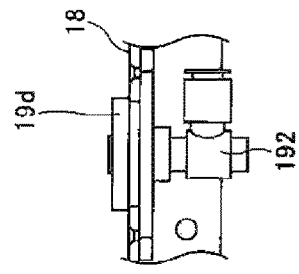
Figure 17C:
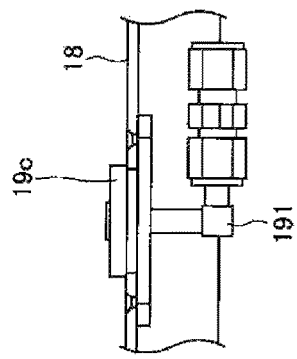
Figure 17A:
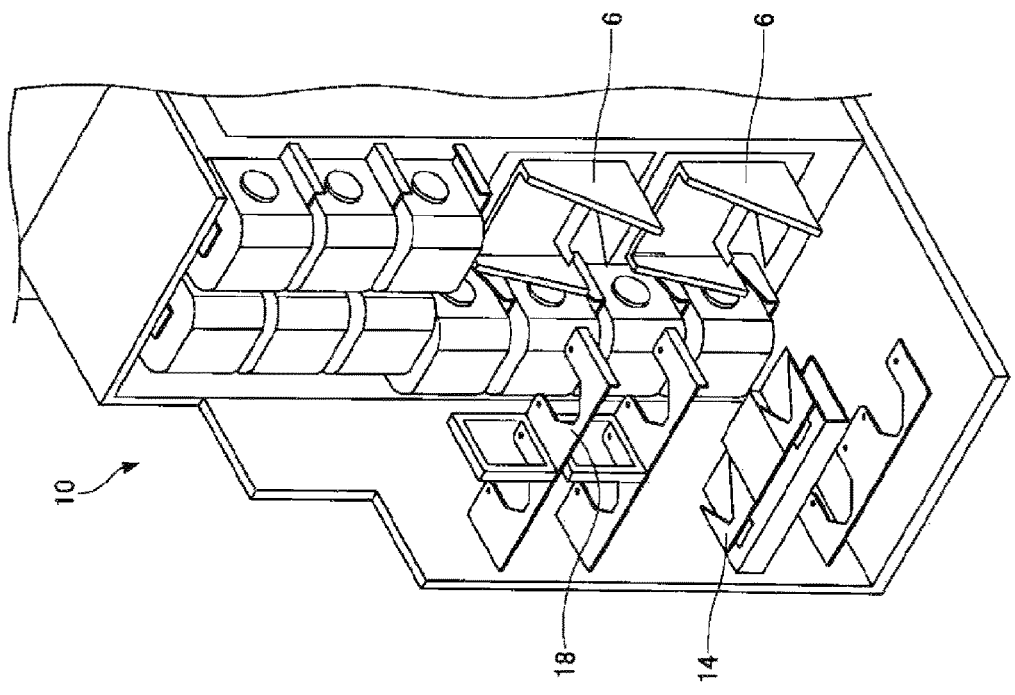

FIGS. 17A to 17D are views for describing a low-speed nitrogen substitution mechanism in the carrier keeping racks 18 of the vertical heat treatment apparatus 10 according to the present exemplary embodiment. FIG. 17A is a view illustrating a configuration of the carrier keeping racks 18 of the vertical heat treatment apparatus 10 according to the present exemplary embodiment. As illustrated in FIG. 17A, a plurality of holes are formed through the placing surface of the carrier keeping rack 18 and configured to supply a gas to the carriers C thereon.

FIG. 17B is a view illustrating a surface of an example of one carrier keeping rack 18 in an enlarged scale. As illustrated in 17B, a supply nozzle 19c and an exhaust nozzle 19d are formed on the surface of the carrier keeping rack 18 and configured to fit with the intake port Cin and the exhaust port Cout of the carrier C so as to supply a nitrogen gas from the supply nozzle 19 to the inside of the carrier C through the intake port Cin of the carrier C and exhaust the nitrogen gas from the exhaust nozzle 19d through the exhaust port Cout of the carrier C. Accordingly, the supply nozzle 19c and the exhaust nozzle 19d are formed at the positions where they are fitted with the intake port Cin and the exhaust port Cout of the carrier C, respectively, when the carrier C is placed on the carrier keeping rack 18.

FIG. 17C is a view illustrating the supply nozzle 19c of the carrier keeping rack 18. The supply nozzle 19c formed on the front surface of the carrier keeping rack 18 is connected to a supply pipe 191 on the rear surface and configured to supply a gas.

FIG. 17D is a view illustrating the exhaust nozzle 19d of the carrier keeping rack 18. The exhaust nozzle 19d formed on the front surface of the carrier keeping rack 18 is connected to an exhaust pipe 192 on the rear surface and configured to exhaust the gas.

Since the carrier keeping rack 18 is provided with the supply nozzle 19c and the exhaust nozzle 19d, the nitrogen substitution may be performed with the intake port CM and the exhaust port Cout of the carrier C even during the keeping of the carrier.

Further, although the supply pipe 191 and the exhaust pipe 192 are not described with respect to the supply nozzle 19a and the exhaust nozzle 19b of the load port 14 as illustrated in FIG. 2, the supply nozzle 19a and the exhaust nozzle 19b of the load port 14 may also be configured to be connected to the supply pipe 191 and the exhaust pipe 192 as in the carrier keeping rack 18.

Figure 18:
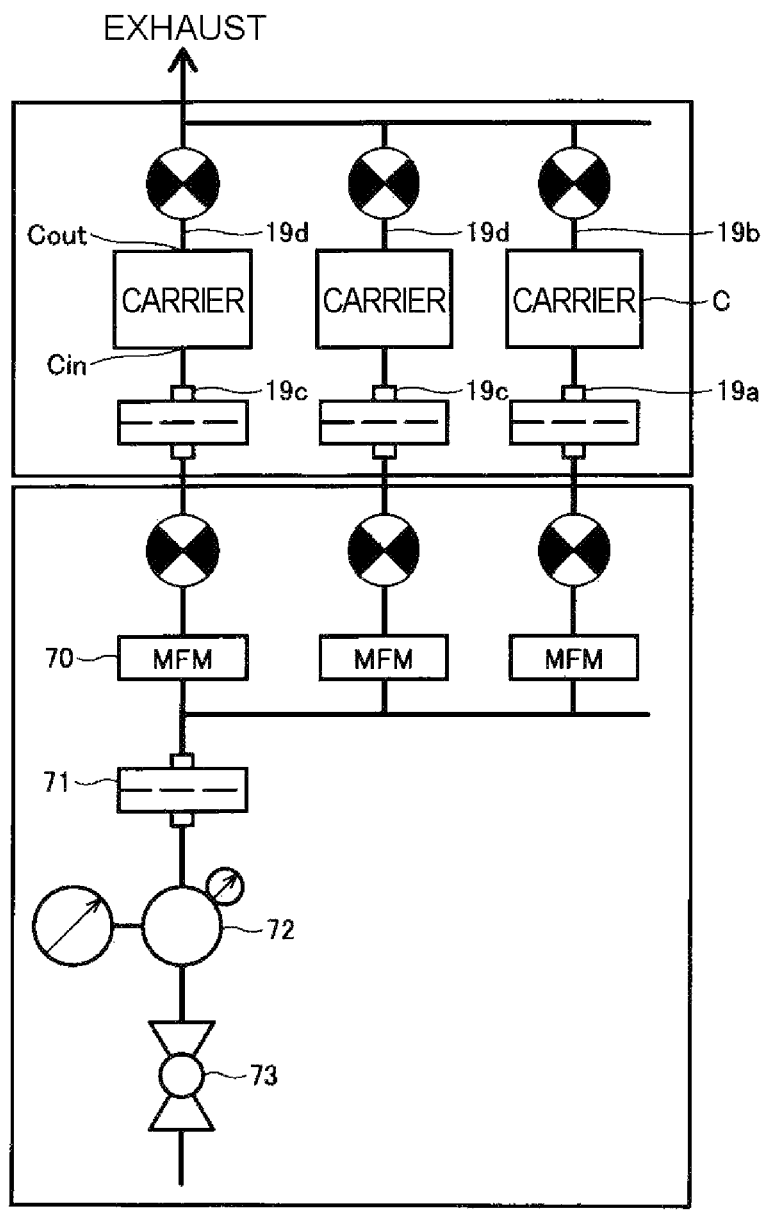
FIG. 18 is a view illustrating an example of a gas substitution unit of the carrier keeping rack of the vertical heat treatment apparatus used in the method for managing an atmosphere in a storage container according to the present exemplary embodiment.

FIG. 18 is a view illustrating an example of gas substitution units for carrier keeping racks 18 and load ports 14 of the vertical heat treatment apparatuses 1, 10 used in the method for managing an atmosphere in a storage container according to the present exemplary embodiment. FIG. 18 exemplifies a gas substitution unit (including the supply nozzles 19c and the exhaust nozzles 19d) for two carrier keeping racks 18 and a gas substitution unit (including the supply nozzle 19c and the exhaust nozzle 19d) for one load port 14 are exemplified. As illustrated in FIG. 18, as a gas supply system configured to supply a nitrogen gas to the carrier C, mass flow meters 70, a filter 71, a pressure regulator 72 and a ball valve 73 are provided. Each of the mass flow meters 70 is provided to correspond to one carrier C and is configured to adjust the flow rate of the nitrogen gas supplied for the carrier C.

For example, when such a gas supply system is provided, the nitrogen gas may be supplied to each of the carriers C at a predetermined flow rate.

In addition, sensors configured to measure the humidity in the carriers C may be provided in the middle of the nitrogen gas supply system, for example, in the exhaust nozzles 19d of the carrier keeping racks 18 to manage the atmosphere in the carriers C by the humidity. A humidity measuring sensor may also be provided in the exhaust nozzle 19b of the load port 14. Further, it is also possible to estimate the humidity in the carriers C from a certain conversion value and manage the atmosphere in the carriers C by the humidity, rather than to measure the humidity directly. As mentioned at the beginning, since it is highly requested that an atmosphere in a carrier C be maintained while it is on standby for processing in a processing apparatus, the atmosphere in the carrier C may be managed based on the humidity.

In the present exemplary embodiment, an example of performing a nitrogen substitution by using nitrogen gas has been described. However, a rare gas such as Ar, Ne or He may be used, and any inert gas may be applied to the present disclosure. In that case, the nitrogen substitution process may be may be referred to as a gas substitution process using each gas, or an inert gas substitution process.

Further, in the present exemplary embodiment, descriptions have been made on an example of applying the method for managing an atmosphere in a storage container of the present disclosure to the vertical heat treatment apparatus. However, the present disclosure may be applied appropriately to any other processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for managing an atmosphere in a storage container in a processing apparatus including a substrate transfer region and a container transfer region which are partitioned by a partition wall having a transfer port that is opened/closed by an opening/closing door; a load port provided in the container transfer region and configured to place the storage container therein; a container keeping rack provided in the container transfer region and configured to temporarily place a storage container configured to hermetically store a plurality of substrates by opening/closing a cover such that the storage container is put on standby; and a cover opening/closing mechanism provided in the opening/closing door, and configured to substitute an internal atmosphere of the storage container with an inert gas while removing the cover of the storage container which is in close contact with an inlet edge of the transfer port, the method comprising:

substituting the internal atmosphere of the storage container that stores non-processed substrates with the inert gas using the cover opening/closing mechanism;

transferring the storage container of which the internal atmosphere has been substituted with the inert gas, to the container keeping rack and placing and keeping the storage container on the container keeping rack; and putting the storage container on standby on the container keeping rack while maintaining the atmosphere substituted with the inert gas, wherein the inert gas starts to be supplied into a closed space between the cover of the storage container and the opening/closing door of the inlet edge of the transfer port before the cover of the storage container is removed, and continuously supplied after the cover of the storage container is removed.

2. The method of claim 1, wherein, when the storage container is placed in the load port and the internal atmosphere is not substituted with the inert gas by the cover opening/closing mechanism, the storage container is transferred to a position at which the cover is removable by the cover opening/closing mechanism.

3. The method of claim 2, wherein, when the storage container is placed in the load port and while an internal gas of another storage container is being substituted with the inert gas by the cover opening/closing mechanism, the storage container is placed temporarily on the container keeping rack, and after the internal gas of the another storage container has been substituted with the inert gas, the storage container is transferred to the position at which the cover is removable by the cover opening/closing mechanism.

4. The method of claim 1, wherein the cover opening/closing mechanism substitutes the internal atmosphere with the inert gas by injecting the inert gas into the storage container at a first flow rate, and the container keeping rack supplies the inert gas into the storage container at a second flow rate which is smaller than the first flow rate.

5. The method of claim 4, further comprising:

temporarily substituting the internal atmosphere of the storage container with the inert gas when the storage container is placed in the load port.

6. The method of claim 5, wherein the internal atmosphere is temporarily substituted with the inert gas at the second flow rate.

7. The method of claim 5, wherein the load port supplies the inert gas from an opening formed at a bottom of the storage container.

8. The method of claim 4, wherein the first flow rate is at least three times higher than the second flow rate.

9. The method of claim 4, wherein a time required for the cover opening/closing mechanism to substitute the internal atmosphere of the storage container with the inert gas is a fifth or less of a time required for the container keeping rack to substitute the internal atmosphere of the storage container with the inert gas.

10. The method of claim 4, wherein the container keeping rack supplies the inert gas from an opening formed at a bottom of the storage container.

11. The method of claim 1, wherein the inert gas is nitrogen gas.

12. The method of claim 1, wherein the atmosphere in the storage container is managed based on humidity.

13. The method of claim 1, further comprising:

moving the storage container, which is on standby on the container keeping rack, to the position at which the cover is removable by the cover opening/closing mechanism; and substituting the internal atmosphere of the storage container with the inert gas while removing the cover by the cover opening/closing mechanism, and carrying the substrates into the substrate transfer region in the storage container.

14. The method of claim 13, wherein the processing apparatus is a batch type processing apparatus provided with a processing container configured to process a plurality of substrates in the storage container at once.

15. The method of claim 14, further comprising:

storing the plurality of substrates, which have been processed by the by the processing container, in the storage container using the cover opening/closing mechanism while substituting the internal atmosphere of the storage container with the inert gas; and temporarily placing the storage container, which stores the plurality of substrates processed by the processing container, on the container keeping rack.

16. The method of claim 15, further comprising:

after the temporarily placing of the container, carrying the storage container out of the processing apparatus.

17. The method of claim 13, wherein a plurality of the cover opening/closing mechanisms is provided, and the moving of the storage container and the carrying of the substrates are performed by the plurality of the cover opening/closing mechanisms in parallel.

18. The method of claim 1, wherein a plurality of cover opening/closing mechanisms is provided, and the plurality of cover opening/closing mechanisms substitutes the internal atmosphere of the storage container with the inert gas in parallel.

19. The method of claim 1, wherein the processing apparatus is a heat treatment apparatus provided with a heat treatment furnace in the substrate transfer region.

20. A method for managing an atmosphere in a storage container in a processing apparatus, the method comprising:

preparing a storage container that stores non-processed substrates with a cover which closes the storage container;

engaging the storage container to an inlet edge of a transfer port while the cover is closed so that the storage container is in close contact with the inlet edge of the transfer port;

starting to supply an inert gas into a closed space between the inlet edge of the transfer port and the storage container;

opening the cover while the storage container remains in close contact with the inlet edge of the transfer port so that a closed space is created between the cover of the storage container and an opening/closing door of the inlet edge of the transfer port;

continuously supplying the inert gas into the closed space while the cover is open but the storage container remains in close contact with the inlet edge of the transfer port; and transferring the storage container to a container keeping rack.

* * * * *